United States Patent
Kenney

(10) Patent No.: US 8,442,173 B2
(45) Date of Patent: May 14, 2013

(54) APPARATUS AND METHOD FOR CLOCK AND DATA RECOVERY

(75) Inventor: John Kenney, West Windsor, NJ (US)

(73) Assignee: Analog Devices, Inc., Norwood, MA (US)

(*) Notice: Subject to any disclaimer, the term of this patent is extended or adjusted under 35 U.S.C. 154(b) by 576 days.

(21) Appl. No.: 12/703,030

(22) Filed: Feb. 9, 2010

(65) Prior Publication Data

US 2011/0194659 A1  Aug. 11, 2011

(51) Int. Cl.
*H04L 7/00* (2006.01)

(52) U.S. Cl.
USPC .......................... 375/355; 375/354

(58) Field of Classification Search .......... 375/355, 375/354
See application file for complete search history.

(56) References Cited

U.S. PATENT DOCUMENTS

| 7,285,994 | B2 | 10/2007 | Dalton et al. | |
|---|---|---|---|---|
| 2003/0094982 | A1 | 5/2003 | Zampetti et al. | |
| 2006/0170470 | A1 | 8/2006 | Wang | |
| 2008/0205570 | A1* | 8/2008 | Baumgartner et al. | 375/376 |
| 2011/0075781 | A1 | 3/2011 | Kenney | |
| 2011/0170560 | A1* | 7/2011 | Kyles et al. | 370/465 |

FOREIGN PATENT DOCUMENTS

WO  WO 2008/074985 A1  6/2008

OTHER PUBLICATIONS

ADN2812: Analog Devices; Continuous Rate 12.3 Mb/s to 2.7 Gb/s Clock and Data Recovery IC with Integrated Limiting Amp; 28 pages (Mar. 2009).

ADN2812: Continuous Rate 12.3 Mb/s to 2.7 Gb/s Clock and Data Recovery IC with Integrated Limiting Amp; 2 pages (Mar. 2009).

Dalton et al., "A 12.5-Mb/s to 2.7-Gb/s Continuous-Rate CDR with Automatic Frequency Acquisition and Data-Rate Readback", *IEEE Journal of Solid-State Circuits*, vol. 40, No. 12; pp. 2713-2725; (Dec. 2005).

Savoj et al., "A 10-Gb/s CMOS Clock and Data Recovery Circuit With a Half-Rate Binary Phase/Frequency Detector", *IEEE Journal of Solid-State Circuits*, vol. 38, No. 1; pp. 13-21; (Jan. 2003).

\* cited by examiner

*Primary Examiner* — David C. Payne
*Assistant Examiner* — Brian J Stevens
(74) *Attorney, Agent, or Firm* — Knobbe Martens Olson & Bear LLP

(57) ABSTRACT

Apparatus and methods for clock and data recovery are disclosed. In one embodiment, a clock and data recovery system includes a sampler, a deserializer, a phase detector and a frequency detector. The sampler may be configured to sample a serial data stream to produce data samples and transition samples. The deserializer may be configured to deserialize the data samples and the transition samples to produce deserialized data samples and deserialized transition samples. The deserialized data samples and the deserialized transition samples can be aligned and provided to the phase detector and the frequency detector, thereby improving phase alignment and cycle slip detection.

17 Claims, 15 Drawing Sheets

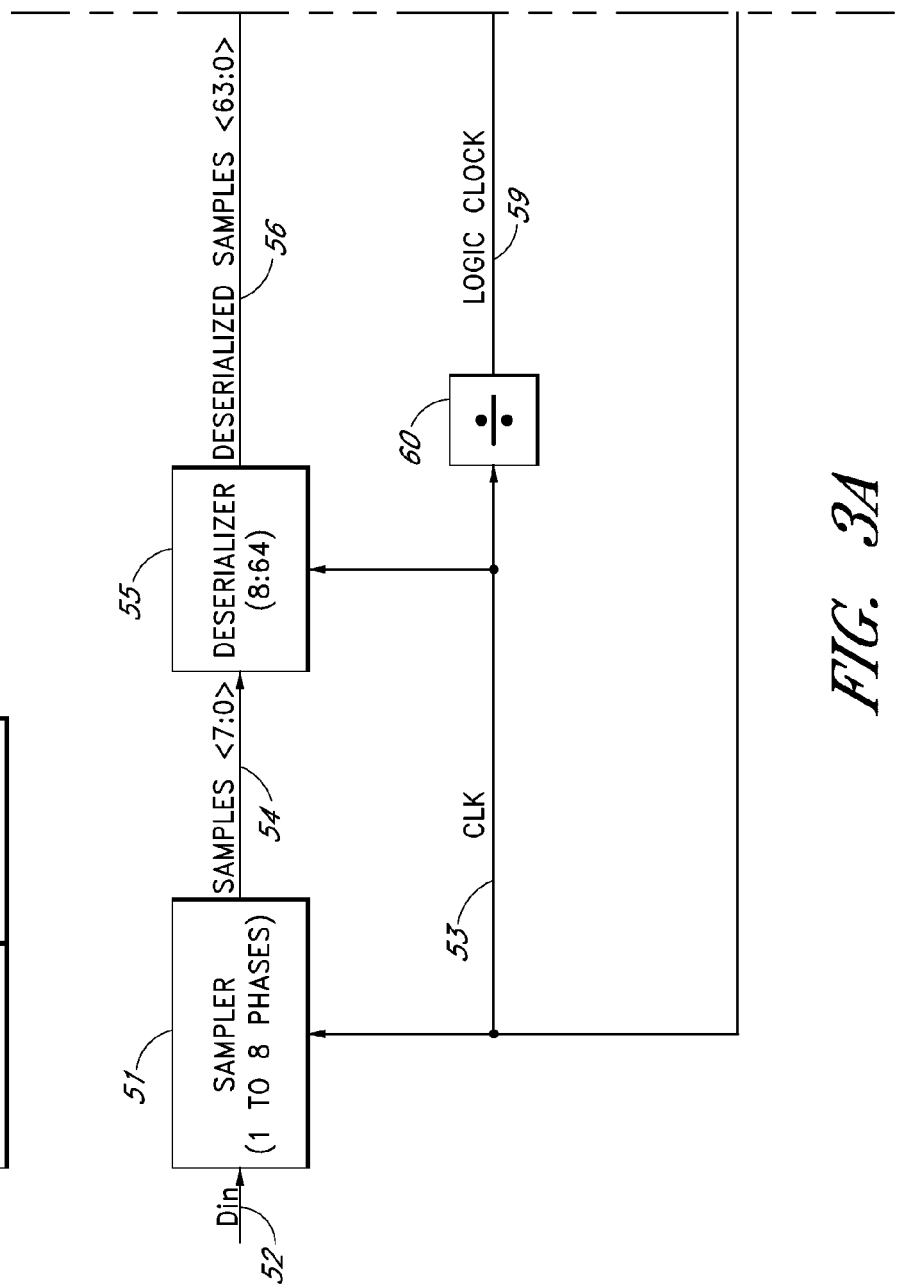

APPARATUS AND METHOD FOR CLOCK AND DATA RECOVERY

CROSS-REFERENCE TO RELATED APPLICATIONS

This application is related to U.S. application Ser. No. 12/703,056, entitled APPARATUS AND METHOD FOR ROTATIONAL FREQUENCY DETECTION (Inventors: John Kenney and Declan Dalton; filed on even date herewith), the disclosure of which is incorporated herein by reference in its entirety.

BACKGROUND

1. Field

Embodiments of the invention relate to electronics, and more particularly, to clock and data recovery systems.

2. Description of the Related Technology

Clock and data recovery (CDR) systems are employed in a variety of applications for recovering data from a high-speed serial data stream sent without a separate clock signal. CDR systems are typically used in, for example, telecommunications systems, optical networks, and chip-to-chip communication.

FIG. 1 is a schematic block diagram illustrating a conventional CDR system. The CDR system 10 includes a sampler 11 which samples data from a serial data stream 12 using a clock signal 13. The serial data stream 12 includes a string of serial data bits that transition at a data rate. At a given data rate, the serial data stream 12 has a unit interval (UI), or minimum time interval between transitions of the serial data stream. As data arrives in the serial data stream 12, the sampler 11 collects a data sample 14, a transition sample 15, a quarter UI sample 16, and a three-quarter UI sample 17. When the CDR system 10 is in a lock condition, the data sample 14 is taken approximately halfway into the UI of the data stream, so as to sample data furthest from the transition points. The transition sample 15 is taken from the beginning of the UI of the data stream during a lock condition, so as to sample the data stream near the points of transition. When the CDR system 10 is in a lock condition, the quarter UI sample 16 and three-quarter UI sample 17 are taken approximately a quarter into the UI and three-quarters into the UI, respectively, and are used for frequency detection.

With continuing reference to FIG. 1, the transition sample 15 and data sample 14 are provided to a phase detector 18, a coarse frequency detector 19, and a rotational frequency detector 20 on a bit-by-bit basis, when they are sampled by the sampler 11 from the serial data stream 12. For high-speed clock and data recovery, the phase and frequency detectors are typically custom circuits designed using a high-speed logic family, such as current mode logic (CML). The necessity of using CML or other high-speed logic families arises from the architectural constraint that the sample rate of the clock signal 13 matches the data rate of the serial data stream 12 during a lock condition. As the data rate of the serial data stream 12 increases, the rate at which samples are collected also increases, and therefore the phase detector 18, the rotational frequency detector 20 and the coarse frequency detector 19 operate at higher frequencies.

The phase and frequency detectors 18, 20, and 19 produce error signals 21 from the samples for use by a clock control block 22 in controlling an oscillator clock signal 26. A typical clock control block 22 includes a low-pass filter 24 and a voltage-controlled oscillator 25. As is well-known in the art, the low-pass filter 24 typically includes a charge pump, a resistor, and a capacitor, and has a filter transfer function selected for loop stability and transient performance. The error signals 21 can direct the charge pump to supply current pulses to the resistor and capacitor in the low-pass filter 24. The voltage-controlled oscillator 25 generates an oscillator clock signal 26 with a frequency which varies in relation to the filtered error signal coming from the low-pass filter 24.

Conventional CDR systems typically use a programmable divider 27 to match the sample rate to the data rate. For example, a VCO 26 that is limited by design to a frequency range of 1.7-3.4 GHz can lock to a rate of 100 Mbps by applying a 3.2 GHz clock signal to the programmable divider 27 with a programmable division rate set to 32. Similarly, the same CDR system locks to a rate of 1 Gbps by applying a 2.0 GHz clock signal to the programmable divider 27 with the programmable division rate set to 2. As a result of this division, the sample rate of the clock signal 13 matches the data rate of the serial data stream 12.

SUMMARY

In one embodiment, a clock and data recovery system comprises a sampler, a deserializer, a phase detector and a frequency detector. The sampler is configured to sample a serial data stream having a plurality of data periods on at least one phase of a clock signal and to extract samples from the serial data stream, the samples comprising a data sample of one or more bits in the serial data stream and a transition sample of the one or more one bits, wherein when the clock and data recovery system is in a locked state, the data sample is taken from a first interval into a data period and the transition sample is taken from a second interval into the data period, wherein the second interval is different from the first interval. The deserializer is configured to convert at least one bit of the data sample to a deserialized data sample, and to convert at least one bit of the transition sample to a deserialized transition sample. The phase detector is configured to receive the deserialized data sample and the deserialized transition sample, and to generate a phase error signal based at least partly on the deserialized data sample and the deserialized transition sample. The frequency detector is configured to receive the deserialized data sample and the deserialized transition sample, and to generate a frequency error signal based at least partly on the deserialized data sample and the deserialized transition sample.

In another embodiment, a method is provided for providing phase alignment in a clock and data recovery system. The method comprises sampling a serial data stream having a plurality of data periods on at least one phase of a clock signal to generate a data sample of at least one bit and a transition sample of at least one bit, wherein the data sample is taken from a first interval into a data period and the transition sample is taken from a second interval into the data period. The method further comprises deserializing at least one bit of the data sample to create a deserialized data sample and at least one bit of the transition sample to create a deserialized transition sample. The method further comprises processing the at least one bit of the deserialized data sample and the at least one bit of the deserialized transition sample in parallel to generate a phase error signal and a frequency error signal, thereby providing phase alignment in the clock and data recovery system. The steps of sampling, deserializing, and processing are performed by electronic hardware.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

DETAILED DESCRIPTION OF EMBODIMENTS

Figure 1:
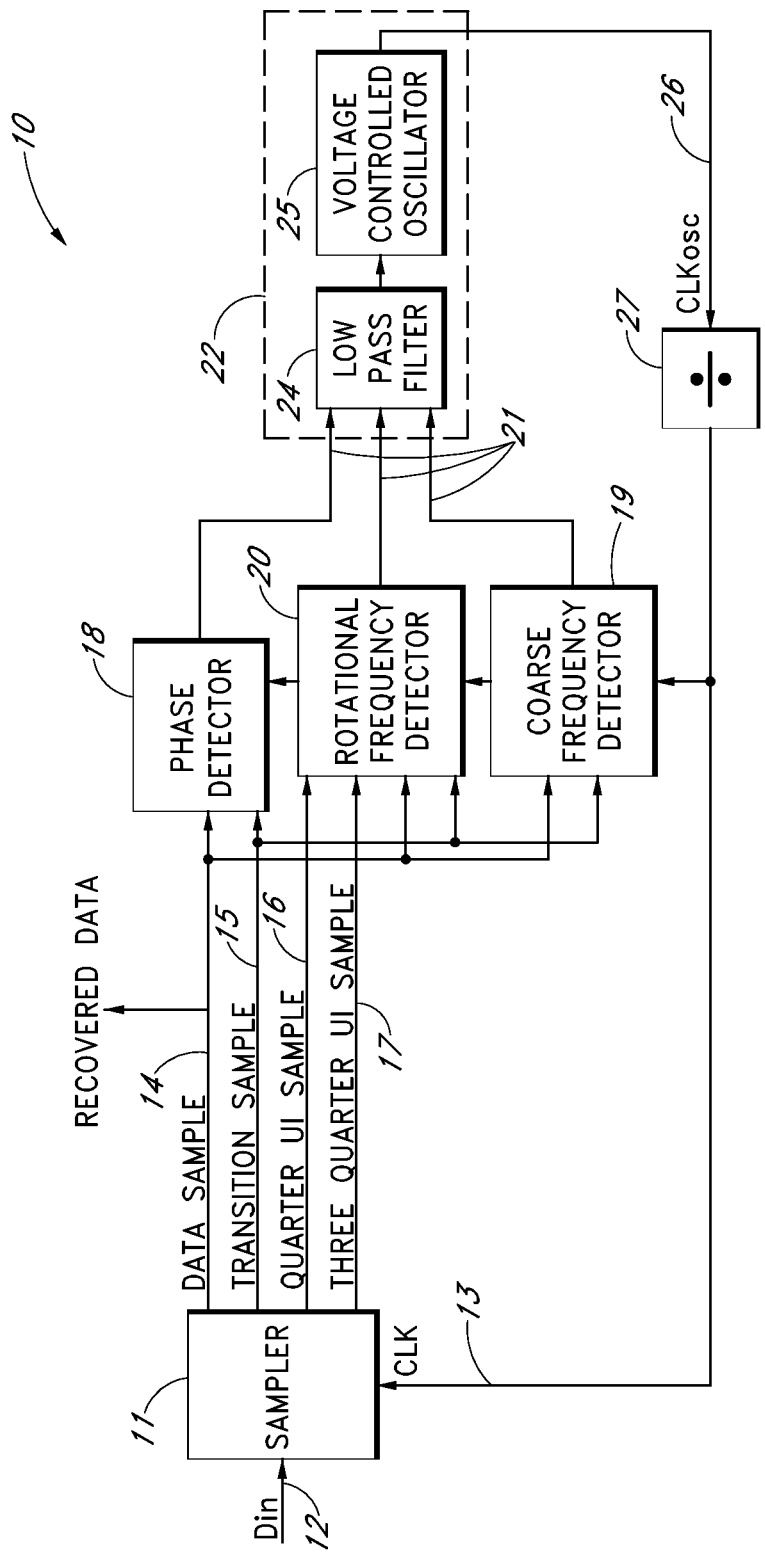
FIG. 1 is a schematic block diagram illustrating a conventional clock and data recovery system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

With continuing reference to FIG. 1, the conventional CDR system 10 typically has phase and frequency detectors designed using custom CML logic or other high-speed logic. This is necessitated by the architecture requiring the sample rate of the clock signal 13 to match the data rate of the serial data stream 12 during a lock condition. The complexity of the CML circuits and the arrival of samples bit-by-bit in time makes precise phase alignment between the phase detector 18 and the rotational frequency detector 20 difficult to maintain when the loop is in a lock condition. Failure to realize well-controlled phase alignment between the two detectors can cause the rotational frequency detector 20 to declare cycle slips and loss-of-lock falsely. In an embodiment described below, the phase and frequency detectors can be designed using static CMOS.

Furthermore, to achieve AC coupling of the clock signal in modes in which the division rate of the programmable divider 27 is large, the conventional CDR system 10 uses a relatively large capacitor between the clock signal 13 and the CML flip-flop used to capture samples. As discussed above, a CDR system 10 with a controlled oscillator limited to a frequency range of 1.7-3.4 GHz locks to a rate of 100 Mbps by applying a 3.2 GHz clock signal to the programmable divider 27 with a programmable division rate set to 32. To achieve AC coupling of the clock signal at 100 MHz as compared to 3.2 GHz a larger capacitor is used, because the RC time constant is 32 times greater.

AC coupling of the clock signal is desirable because it blocks DC offset in differential signals that are a main source of duty cycle distortion, and therefore sub-optimal sampling. Additionally, AC coupling of the clock signal allows the clock signal and the serial data stream to have different common-mode voltage levels. In some embodiments, such as embodiments using one or more NMOS CML latches to sample the serial data stream, it may be preferred to have the common-mode level of the clock signal shifted a few hundred mV below the common-mode level of the serial data stream to provide voltage headroom for the transistors receiving the clock signal. In an embodiment described below, AC coupling of the clock signal can be achieved using a capacitor of a smaller value, and therefore smaller circuit area, relative to that used in a conventional CDR system.

There is a need for a CDR system that has well-controlled phase alignment. Furthermore, there is a need for a CDR system having phase and frequency detectors with well-controlled phase alignment and which are designed using a conventional static CMOS circuit design flow. Moreover, there is a need for a CDR system that can achieve AC coupling of the clock signal with a capacitor of a small value relative to that used in a conventional CDR system.

Figure 2:
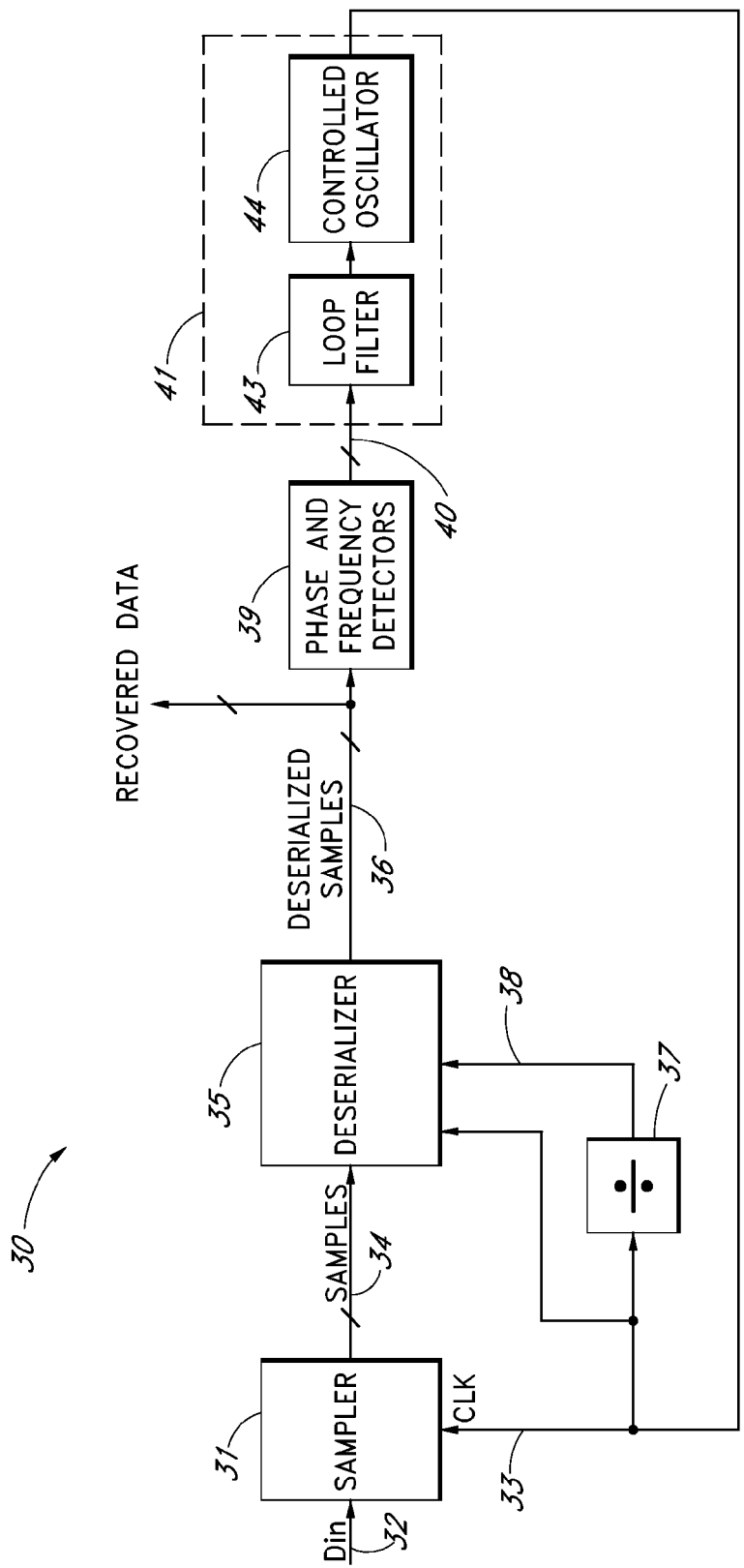
FIG. 2 is a schematic block diagram of a clock and data recovery system according to one embodiment.

FIG. 2 is a schematic block diagram of a CDR system according to one embodiment. The CDR system 30 includes a sampler 31, a deserializer 35, a divider 37, phase and frequency detectors 39, a loop filter 43 and a controlled oscillator 44. As will be described below, the CDR system 30 has phase and frequency detectors 39 with well-controlled phase alignment and improved cycle slip detection relative to a conventional CDR system. Additionally, the CDR system 30 allows AC coupling of the clock signal with a capacitor of a smaller value, and therefore smaller circuit area, than that used in a conventional CDR system.

The sampler 31 samples the serial data stream 32 on one or more edges of a clock signal 33 to produce samples 34. The serial data stream 32 includes a string of serial data bits that transition at a data rate. At a given data rate, the serial data stream 32 has a unit interval (UI), or minimum time interval between transitions of the serial data stream. The samples 34 are taken by the sampler 31 and are used to lock the CDR system to the serial data stream 32. When the CDR is in a lock condition, the samples 34 can include samples taken from specific positions into the UI of the serial data stream 32.

In one embodiment, the samples 34 include data samples taken from approximately halfway into the UI of the data stream during a lock condition, so as to sample data furthest from the transition points. In another embodiment, the samples 34 include one or more bits of transition samples taken from the beginning of the UI during a lock condition, so as to sample the data stream near the points of transition. In yet another embodiment, the samples 34 can include samples taken approximately a quarter into the UI and three-quarters into the UI for use in frequency detection. Persons of ordinary skill in the art will readily recognize other choices for sampling points taken into the UI during a lock condition.

With continuing reference to FIG. 2, the samples 34 are provided to the deserializer 35, which deserializes the samples 34 to create deserialized samples 36. The samples 34 can be provided to the deserializer 35, on one or more bit streams and the samples to be deserialized can include bits of data samples, transition samples, quarter UI samples and three-quarter UI samples as described above. In one embodiment, the deserializer 35 receives an 8-bit wide stream of the samples 34 and deserializes the samples by a factor of 8 to produce 64 one-bit streams of the deserialized samples 36. In another embodiment, all of the bit streams of the deserialized samples 34 are adapted to transition at substantially the same time with respect to each other. In yet another embodiment, two or more bit streams of the deserialized samples 36 are adapted to transition at substantially the same time with respect to each other.

The divider 37 can provide a logic clock signal 38 to the deserializer 35 based on either a variable or fixed division. The logic clock signal 38 can be used by the deserializer 35 to align one or more bit streams of the deserialized samples 36. The deserializer 35 can receive the clock signal 33 to aid in deserialization. In one embodiment, one or more bit streams of the deserialized samples 36 transition at a frequency less than the data rate of the serial data stream 32. In another embodiment, the deserialized samples 36 include one or more bit streams adapted to transition at a rate equal to the frequency of the logic clock signal 38.

By allowing one or more bit streams of the deserialized samples 36 to transition at a frequency less than the data rate, the frequency at which the phase and frequency detectors 39 can operate is less than that of a conventional CDR system where samples are provided to detectors as the samples arrive. Accordingly, after a sufficient degree of deserialization of the samples, the phase and frequency detectors can be designed using a conventional circuit design flow, such as a static CMOS digital design flow. Additionally, in another embodiment, the bit streams of the deserialized samples 36 can transition at substantially the same time, for example, after the rising or falling edge of the logic clock signal 38.

By deserializing the samples, rather than providing the sampled data directly into the phase and frequency detectors, aligned samples can be generated and inputted into matched phase and frequency detector circuits designed using a conventional digital design flow, such as a static CMOS digital design flow. Because the samples are aligned and the circuits have matched timing, phase alignment is well-controlled and cycle slip detection is improved.

The phase and frequency detectors 39 generate error signals 40 which are provided to the clock control block 41. As persons of ordinary skill in the art will recognize, numerous implementations of the clock control block 41 are possible. In one embodiment, the clock control block 41 includes a loop filter 43 and a controlled oscillator 44. In one embodiment, the loop filter 43 includes at least one charge pump and/or digital integrator. The loop filter 43 can include a low-pass filter such as a single-pole RC filter or a more complicated multi-pole filter, with or without an amplifier. The controlled oscillator 44 can be, for example, a voltage-controlled oscillator or a current-controlled oscillator. In one embodiment, the controlled oscillator 44 is a voltage-controlled oscillator including an inductor and capacitor (LC) tank circuit.

The error signals 40 can be used by the clock control block 41 to change frequency up or down, extend or contract one or more clock signal periods, or perform a number of other phase and frequency related control operations, as is well known in the art. The resulting clock signal 33 is provided to the sampler 31. In one embodiment, the CDR system 30 does not need a fixed or programmable divider between the controlled oscillator 44 and the sampler 31.

With continuing reference to FIG. 2, in one embodiment, the sampler 31 samples the serial data stream 32 on eight phases of the clock signal 33 to generate two data samples, two transition samples, two quarter UI samples, and two three-quarter UI samples. In this embodiment, the samples 34 are provided to an 8-to-64 deserializer 35 while the divider 37 divides the clock signal 33 by eight to produce the logic clock signal 38. The deserializer 35 uses the logic clock signal 38 to substantially align the deserialized samples 36. Thus, the deserializer 35 receives 64 samples from the serial data stream 32 serially in time, and provides the samples as a substantially aligned bundle of 64 bits that transitions at divided down frequency of the logic clock signal 38. Accordingly, the phase and frequency detectors 39 receive 16 bits of deserialized data samples, 16 bits of deserialized transition samples, 16 bits of deserialized quarter UI samples, and 16 bits of deserialized three-quarter UI samples in substantially aligned bundles.

The advantages of the embodiment described above are numerous. When the data rate is about 10 Gbps, in a lock condition the clock signal 33 will operate at about 5 GHz and the deserialized samples will arrive to the phase and frequency detectors 39 at about 625 Mbps. Thus, when recovering data at about 10 Gbps, phase and frequency detection is performed at about 625 MHz. The gate delay in a typical 0.13 μm process is short enough to allow the phase and frequency detectors 39 to operate at 625 MHz using static CMOS. Thus, when using a typical 0.13 μm process, the CDR system described above can have phase and frequency detectors implemented with static CMOS rather than with CML logic. Using static CMOS improves phase alignment between the phase and frequency detectors because static CMOS timing paths can be well matched by using static CMOS digital design techniques that are well known in the art, such as transistor sizing, layout matching, and balancing capacitive loads. Additionally, phase alignment is well controlled because the deserialized samples can be aligned in time and provided simultaneously to the phase and frequency detector circuits.

The advantages described above are achieved by the addition of a deserializer in the loop of the CDR system. A block that contributes latency, such as a deserializer, is typically not placed in the gain path of the loop because it contributes latency to the loop which can create jitter. However, the advantages described above, such as well-controlled phase alignment or simplified phase and frequency detection circuitry, can outweigh the drawback of increased loop latency. In one embodiment, the amount of deserialization is selected such that the deserialized samples transition at a rate substantially equal to the highest clock signal frequency that the phase and frequency detectors can be realized in static CMOS.

Although the embodiment above was described with reference to specific choices of deserialization, sampling, and phase and frequency detection, persons of ordinary skill in the art will recognize that numerous other design choices are possible. In another embodiment, the divider 37 can operate to divide the clock signal 33 by 10 to produce a logic clock signal 38 operating at one-tenth the clock signal frequency. In this embodiment, the deserializer can perform an 8-to-80 deserialization. In yet another embodiment, the sampler 31 can sample on four phases of the clock signal 33, and the deserializer can perform a 4-to-32 deserialization.

Figure 3B:
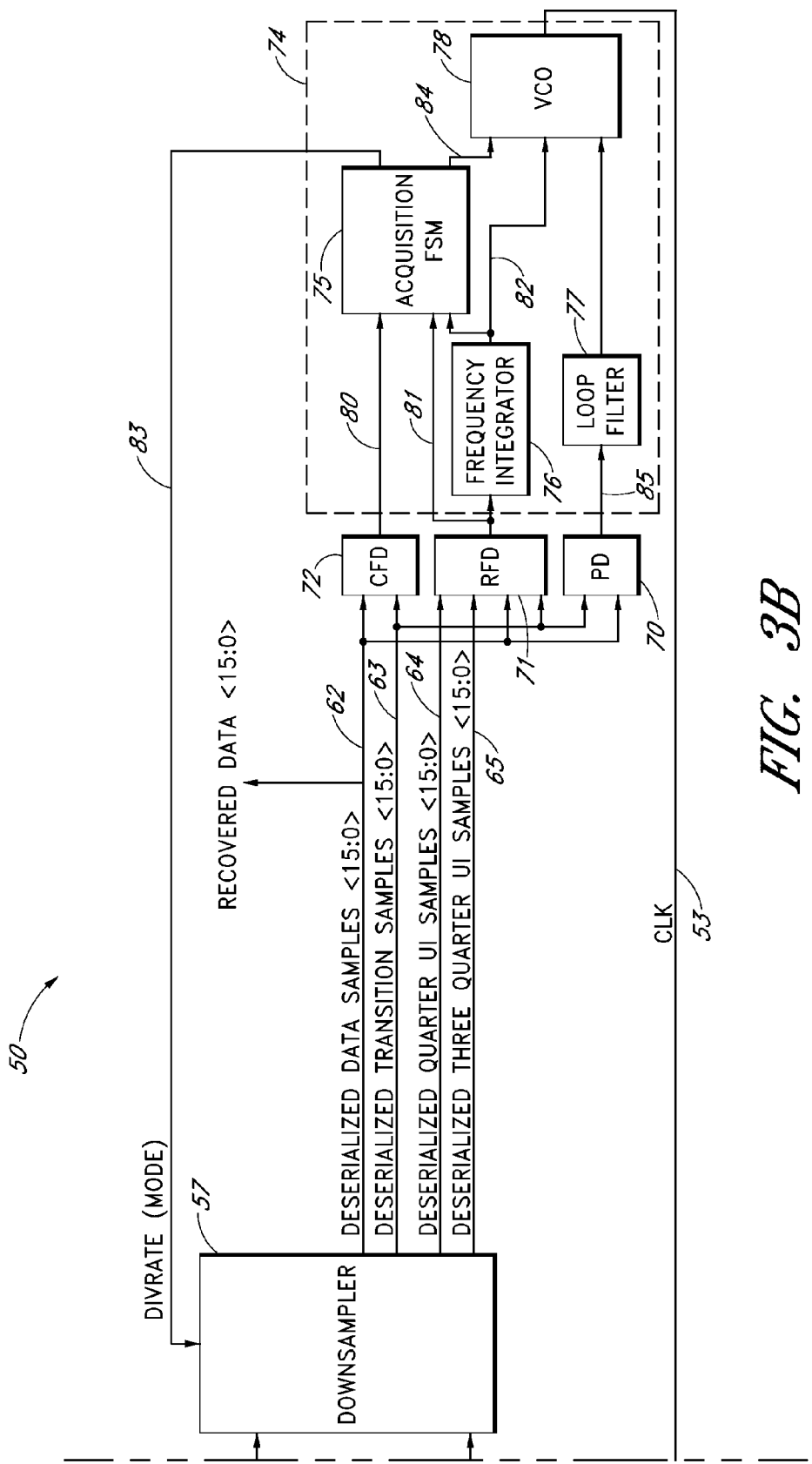
FIG. 3 consists of FIGS. 3A and 3B and illustrates a schematic block diagram of a clock and data recovery system according to another embodiment.

FIG. 3 is a schematic block diagram of a CDR system according to another embodiment. The illustrated CDR system 50 includes a sampler 51, a deserializer 55, a divider 60, a downsampler 57, a coarse frequency detector 72, a rotational frequency detector 71, a phase detector 70, a clock control block 74, a frequency integrator 76, a loop filter 77, an acquisition finite state machine 75, and a voltage-controlled oscillator 78. As illustrated in FIG. 3, the CDR system includes the downsampler 57, which increases the flexibility of the system by allowing lock over a relatively large range of data rates.

The illustrated CDR system 50 includes the sampler 51, which samples data from a serial data stream 52 on a clock signal 53. In one embodiment, the sampler 51 is configured to sample the serial data stream on either one phase, two phases, four phases or eight phases of the clock signal 53, as will be discussed with reference to FIGS. 4-6 below. The serial data stream 12 includes a string of serial data bits having a data rate and a UI. The samples taken by the sampler 51 appear as samples 54, which may or may not be deserialized to a first degree of deserialization. In one embodiment, the samples 54 include data samples, transition samples, quarter UI samples, and three-quarter UI samples.

The samples 54 are provided to the deserializer 55 configured to deserialize the samples 54 to produce deserialized samples 56. In one embodiment the deserializer performs an 8-to-64 deserialization. In another embodiment, the deserializer performs an 8-to-80 deserialization.

The deserialized samples 56 are provided to the downsampler 57, which is operable to select bits of the deserialized samples 56 for use in phase and frequency detection depending on the selected mode of the CDR system 50. In some embodiments, the downsampler 57 receives a logic clock signal 59, which can be a divided version of the clock signal 53 produced by a divider 60. In one embodiment, the divider 60 divides the clock signal 53 by 8. In another embodiment, the divider 60 divides the clock signal 53 by 10. In yet another embodiment, the divider 60 is programmable, and can be configured to divide the clock signal 53 by 8 or 10.

The logic clock signal 59 can be used by the deserializer 55 to align one or more bit streams of the deserialized samples 56. In one embodiment, the deserializer 55 receives the clock signal 53 for use in deserialization. In another embodiment, one or more bit streams of the deserialized samples 56 transition at a frequency less than the data rate of the serial data stream 52. In yet another embodiment, the deserialized samples 56 include one or more bit streams adapted to transition at a rate equal to the frequency of the logic clock signal 59.

With continuing reference to FIG. 3, the downsampler 57 is configured to select bits of the deserialized samples 56 for use in phase and frequency detection depending on the mode the CDR system 50 is configured to. The inclusion of the downsampler 57 increases the flexibility of the system by allowing acquisition of the serial bit stream 52 over a larger range of data rates. In particular, depending on the approximate data rate of the serial data stream 52, the CDR system 50 can set itself in a variety of modes which allow the CDR system 50 to function similarly despite drastic changes of the data rate of the serial data stream 52. For purposes of illustration only, one implementation of the modes of the CDR system 50 is shown in Table 1 below.

TABLE 1

| Data Rate | Mode | CLK frequency | Logic Clock Signal Frequency |
|---|---|---|---|
| 10 Gbps | Half-Rate | 5 GHz | 625 MHz |
| | Full-Rate | 10 GHz | 1.25 GHz |
| | Oversample by 2 | 20 GHz | 2.50 GHz |
| | Oversample by 4 | 40 GHz | 5 GHz |
| | Oversample by 8 | 80 GHz | 10 GHz |
| | Oversample by 16 | 160 GHz | 20 GHz |
| | Oversample by 32 | 320 GHz | 40 GHz |
| 1.25 Gbps | Half-Rate | 625 MHz | 78.13 MHz |
| | Full-Rate | 1.25 GHz | 156.25 MHz |
| | Oversample by 2 | 2.50 GHz | 312.50 MHz |
| | Oversample by 4 | 5 GHz | 625 MHz |
| | Oversample by 8 | 10 GHz | 1.25 GHz |
| | Oversample by 16 | 20 GHz | 2.50 GHz |
| | Oversample by 32 | 40 GHz | 5 GHz |
| 156.25 Mbps | Half-Rate | 78.13 MHz | 9.77 MHz |
| | Full-Rate | 156.25 MHz | 19.53 MHz |
| | Oversample by 2 | 312.50 MHz | 39.06 MHz |
| | Oversample by 4 | 625 MHz | 78.13 MHz |
| | Oversample by 8 | 1.25 GHz | 156.25 MHz |
| | Oversample by 16 | 2.50 GHz | 312.50 MHz |
| | Oversample by 32 | 5 GHz | 625 MHz |

Table 1 illustrates how the inclusion of a configurable downsampler 57 helps to allow the CDR system 50 operate similarly despite order of magnitude changes in the data rate of the serial data stream 52. In particular, in the oversample by 2, 4, 8, 16, and 32 modes, the clock signal 53 operates at a frequency greater than that of the data rate, while the downsampler 57 selects appropriate bits of the deserialized samples 56. This process effectively decouples the sampling rate from the frequency of the clock signal 53, allowing the system to lock without using a programmable divider in the loop. The selection process is detailed below with reference to FIGS. 4-6.

The ability to downsample allows flexibility in controlling the frequency of the clock signal 53 relative to the data rate of the serial data stream 52. As illustrated by Table 1, at data rates of about 10 Gbps, 1.25 Mbps and 156.25 Mbps, the frequency of clock signal 53 and logic clock signal 59 can be fixed at about 5 GHz and 625 MHz, respectively, by selecting half-rate sampling at about 10 Gbps, oversampling by 4 at about 125 Mbps and oversampling by 32 at about 156.25 Mbps. The ability of the CDR system 50 to control the clock signal frequency relative to the data rate is accomplished by the process of oversampling the serial data stream 52 and subsequently downsampling the samples using the downsampler 57. Conventional CDR systems, such as the system illustrated in FIG. 1, utilize a programmable divider 27 in order to accomplish this goal. For example, a controlled oscillator that is limited to a frequency range of about 1.7-3.4 GHz would lock to a rate of about 100 Mbps by applying about a 3.2 GHz clock signal to the programmable divider having a programmable division rate set to 32. The CDR system 50 avoids the need for a programmable divider in the loop, such as the programmable divider 27 in FIG. 1, by the process of oversampling, deserializing and downsampling.

Removing the programmable divider from the frequency acquisition loop allows AC coupling of the clock signal 53 using a capacitor of a smaller value, and therefore smaller circuit area, than that used in a conventional CDR system. As illustrated by Table 1 above, at data rates of about 10 Gbps, 1.25 Mbps and 156.25 Mbps, the frequency at lock of clock signal 53 can be fixed at about 5 GHz by setting the system to half-rate mode, oversample by 4, and oversample by 32 respectively. Despite the large variation in data rate on the serial data stream 52, the clock signal used by the sampler 51 in this example is at about 5 GHz. In a conventional CDR system, the clock signal used for sampling matches the data rate. Accordingly, at a data rate of about 156.25 Mbps, a conventional CDR system would utilize about a 156.25 MHz sampling clock signal. Thus, the CDR system 50 illustrated in FIG. 3 can achieve AC coupling with smaller circuit elements, as the RC time constant of the clock signal 53 is significantly less than that of a sampling clock signal in a conventional architecture.

With reference back to FIG. 3, the downsampler 57 is operable to select bits of the deserialized samples 56 for use in phase and frequency detection, depending on the mode to which the acquisition finite state machine 75 of the clock control block 74 configures the CDR system 50. In one embodiment, the deserialized samples selected by the downsampler 57 include the deserialized data samples 62, the deserialized transition samples 63, the deserialized quarter UI samples 64 and the deserialized three-quarter UI samples 65. In the embodiment shown in FIG. 3, the deserializer 55 can be configured to align at least some of the samples selected by the downsampler 57 and provide them to phase and/or frequency detectors 70-72 at a rate less than the data rate of the serial data stream 52. As illustrated in FIG. 3, deserialized samples are sent to the phase detector 70, the rotational frequency detector 71, and the coarse frequency detector 72. As persons of ordinary skill in the art will recognize, there are many ways of implement phase and frequency detection in a CDR system. In addition, one or more of the phase detector 70, rotational frequency detector 71, and coarse frequency detector 72 can be omitted in some embodiments.

The phase detector 70, the coarse frequency detector 72, and the rotational frequency detector 71 can be implemented in a variety of ways, as discussed below with reference to FIGS. 9-12. The phase and frequency detectors 70-72 can produce error signals used by the clock control block 74. As persons of ordinary skill in the art will recognize, numerous implementations of the clock control block 74 are possible, such as those discussed above with reference to FIGS. 1 and 2. However, one embodiment of the clock control block 74 is described below in connection with FIG. 3.

The illustrated clock control block 74 includes the acquisition finite state machine (FSM) 75, the frequency integrator 76, the loop filter 77, and the voltage-controlled oscillator (VCO) 78. The acquisition FSM 75 includes a counter indicating the sampling rate of the clock signal 53. The value of the counter is decoded into a division rate 83 and a VCO segment 84. The division rate 83 is used by the downsampler 57 and/or other blocks to put the clock and data recovery system 50 in the desired mode, depending on the data rate of the serial data stream 52. The VCO segment 84 is used by the VCO 78 to control the frequency of the clock signal 53. In one embodiment, the VCO 78 is implemented using a LC tank circuit, and the VCO segment 84 is used by the VCO to switch discrete capacitances either into or out of the LC tank.

The counter of the acquisition finite state machine 75 is incremented or decremented based on a coarse frequency detector or CFD error signal 80 from the coarse frequency detector 72 and a frequency integrator error signal 82 from the frequency integrator 76. In one embodiment, the counter of the acquisition finite state machine 75 can also be incremented or decremented by a rotational frequency detector or RFD error signal 81 from the rotational frequency detector 71. In another preferred embodiment, the CFD error signal 80 indicates if the sampling rate is below the data rate, and if so the counter of the acquisition finite state machine 75 can be incremented.

The frequency integrator 76 can be implemented in a variety of ways, such as by an analog charge pump or a digital integrator. The frequency integrator 76 receives the RFD error signal 81, and provides the acquisition FSM 75 with the frequency integrator error signal 82. In one embodiment, the RFD error signal 81 is used to modify the contents of the frequency integrator 76. In one embodiment, the clock control block includes a comparator that determines if the frequency integrator 76 is at a minimum or maximum bound. If so, the counter in the acquisition finite state machine 75 can be incremented or decremented while the content of the frequency integrator 76 can remain unchanged.

With continuing reference to FIG. 3, the phase detector 70 provides a phase detector or PD error signal 85 to the loop filter 77 in order to control the phase of the clock signal 53 relative to the serial data stream 52. The loop filter 77 can include, for example, one or more digital integrators, analog charge pumps, and/or analog filters. As persons of ordinary skill in the art will recognize, the loop filter 77 helps to ensure loop stability and improve transient performance by filtering the PD error signal before the signal is received by the VCO 78. In one embodiment, when an early clock signal 53 is detected, the PD error signal 85 directs VCO 78 to extend its period for one or more cycles so that subsequent sampling clock signals move later in time.

After being filtered or processed by one or more loop filters, integrators or finite state machines, the error signals described above can be used by the VCO 78 to change frequency up or down, extend or contract one or more clock signal periods, or perform a number of other phase and frequency related control operations. The illustrated VCO 78 receives three error signals, each of which can be one or more analog and/or digital signals. Skilled artisans will recognize that any number and type of error signals can be used to control the VCO 78. In one embodiment, the VCO 78 includes an LC tank circuit, the frequency integrator error signal 82 is a coarse frequency tuning signal, and the filtered PD error signal is a fine frequency tuning signal. The VCO segment 84 can switch one or more discrete capacitances into or out of the LC tank.

When far away from a lock condition, the rotational frequency detector 71 can be disabled, as in some embodiments the frequency pull-in range of the rotational frequency detector is limited. In these embodiments, one or more error signals from the coarse frequency detector 72 are used to bring the CDR system 50 near a lock condition. At this point, the coarse frequency detector 72 can be disabled, and the rotational frequency detector 71 can be enabled. The rotational frequency detector 71 and phase detector 70 can be configured to work in combination to generate error signals used to guide the clock signal 53 to the proper phase and frequency in order to achieve a lock condition. Once in a lock condition, the rotational frequency detector 71 can be temporarily powered off using a number of power-conservation techniques, including clock signal gating. In one embodiment, when in a lock condition, the rotational frequency detector 71 is powered off about 90% of the time and powered on about 10% of the time.

Figure 4:
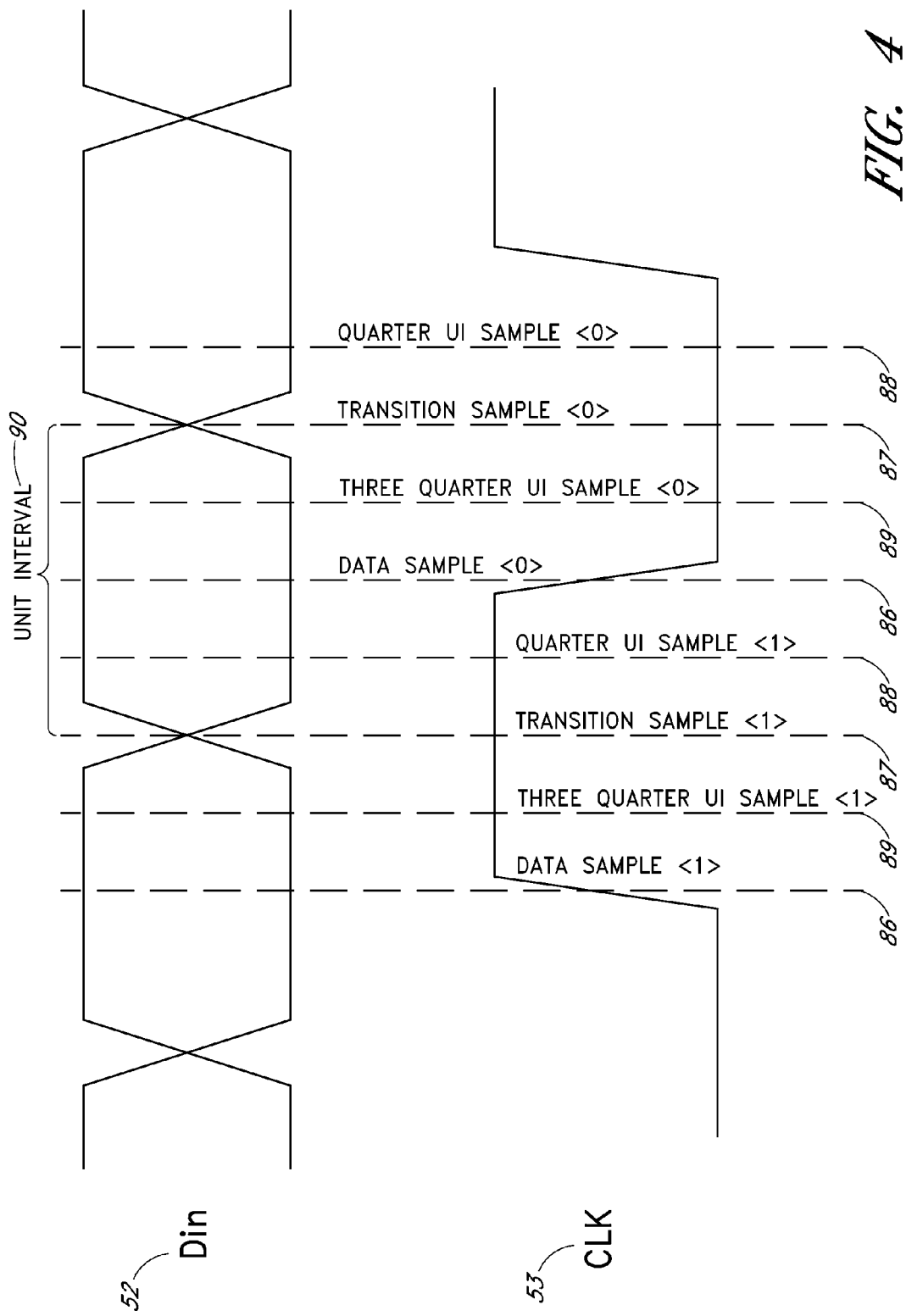
FIG. 4 is a timing diagram illustrating the operation of one embodiment of the sampler of FIG. 3 during half-rate sampling.

FIG. 4 is a timing diagram illustrating the operation of the sampler 51 of FIG. 3 during half-rate sampling according to one embodiment. As illustrated, the clock signal 53 transitions at a rate half that of the serial data stream 52, and the clock signal samples the serial data stream 52 on eight phases. For purposes of illustration only, the serial data stream 52 has a unit interval or UI 90, which begins and ends on a transition.

When in a lock condition, the data samples 86 are taken from approximately halfway into the unit interval of the data stream, so as to sample data furthest from the transition points. As illustrated, during a lock condition the transition samples 87 are taken from the beginning of the UI of the data stream, so as to sample the data stream near the points of transition. During a lock condition, the quarter UI samples 88 and three-quarter UI sample 89 are taken approximately a quarter into the UI and three-quarters into the UI respectively, and can be used for frequency detection. Although the illustrated embodiment shows samples being taken at specific points into the unit interval during a lock condition, persons of ordinary skill in the art will realize that a CDR system can collect samples from the data at a variety of points within the UI.

Figure 5:
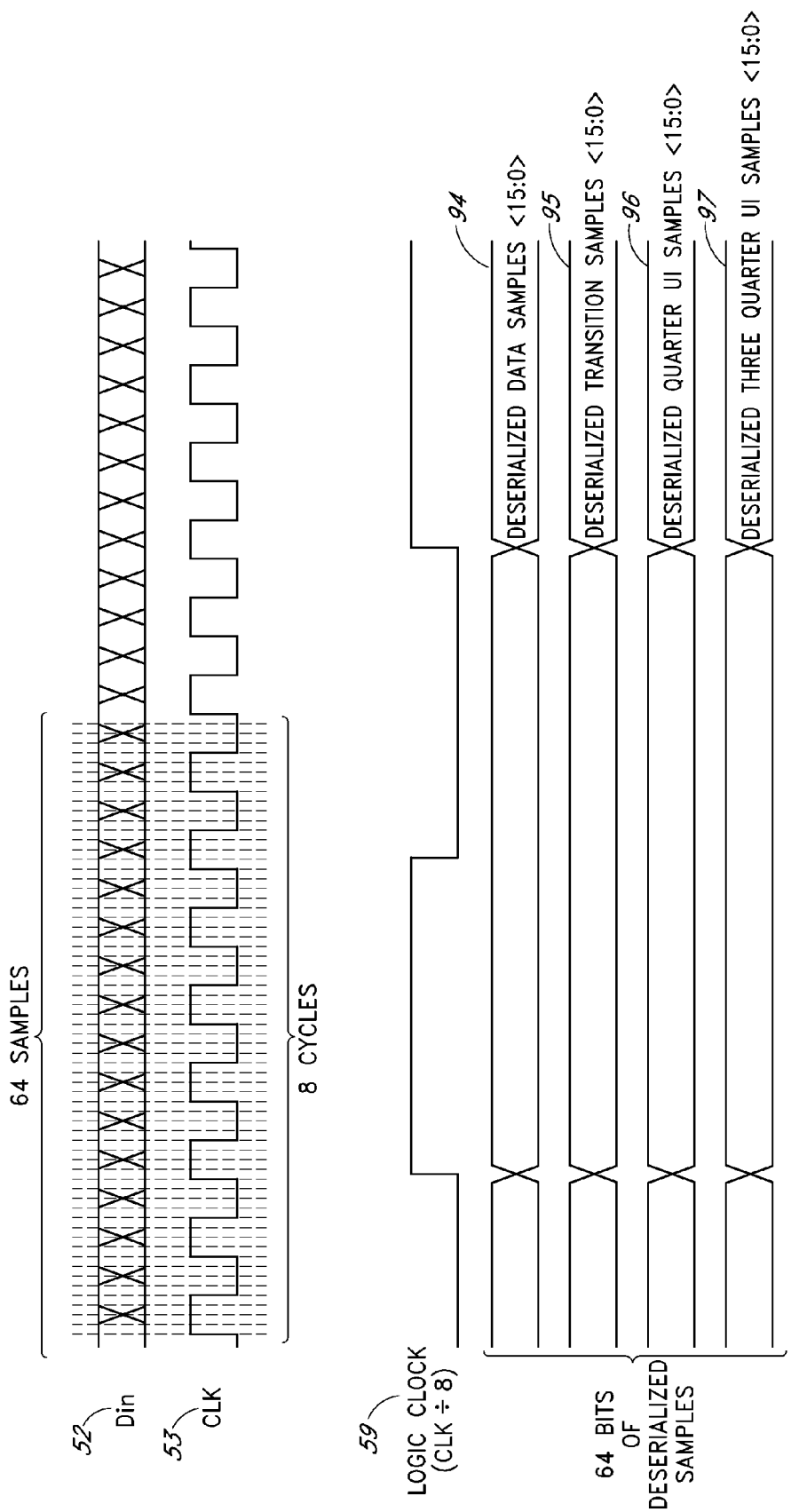
FIG. 5 is a timing diagram illustrating the operation of one embodiment of the deserializer of FIG. 3 during half-rate sampling.

FIG. 5 is a timing diagram illustrating the operation of the deserializer 55 of the embodiment described earlier in connection with FIG. 3 during half-rate sampling. As was shown in FIG. 4, the clock signal 53 samples the serial data stream 52 on eight phases. In the illustrated embodiment, the logic clock signal 59 is produced by dividing the clock signal 53 by eight, and the degree of deserialization is 8-to-64. Persons of ordinary skill in the art will recognize that many choices for the division used to produce the logic clock signal 59 are possible, and many degrees of deserialization can be chosen. In one embodiment, the logic clock signal 59 can be produced by dividing the clock signal 53 by 10, and 8-to-80 deserialization can be performed.

With continuing reference to FIG. 5, the sampler 51 produces 64 bits of samples of the serial data stream 52 over 8 cycles of the clock signal 53. The subsequent process of deserialization produces 16 bits of deserialized data samples 94, 16 bits of deserialized transition samples 95, 16 bits of deserialized quarter UI samples 96, and 16 bits of deserialized three-quarter UI samples 97. Although the illustrated deserialized samples transition in response to the rising edge of the logic clock signal 59, persons of ordinary skill in the art will recognize that the deserialized samples could transition in response to the falling edge of the logic clock signal 59 or any of a number of other timing events.

In the timing diagram illustrating the operation of one example of the deserializer during half-rate sampling, no downsampling is needed. In particular, none of the samples taken by the clock signal 53 are discarded. Accordingly, with reference back to FIG. 3, in some configurations of the CDR system 50, the downsampler 57 need not downsample the deserialized samples 56.

Figure 6:
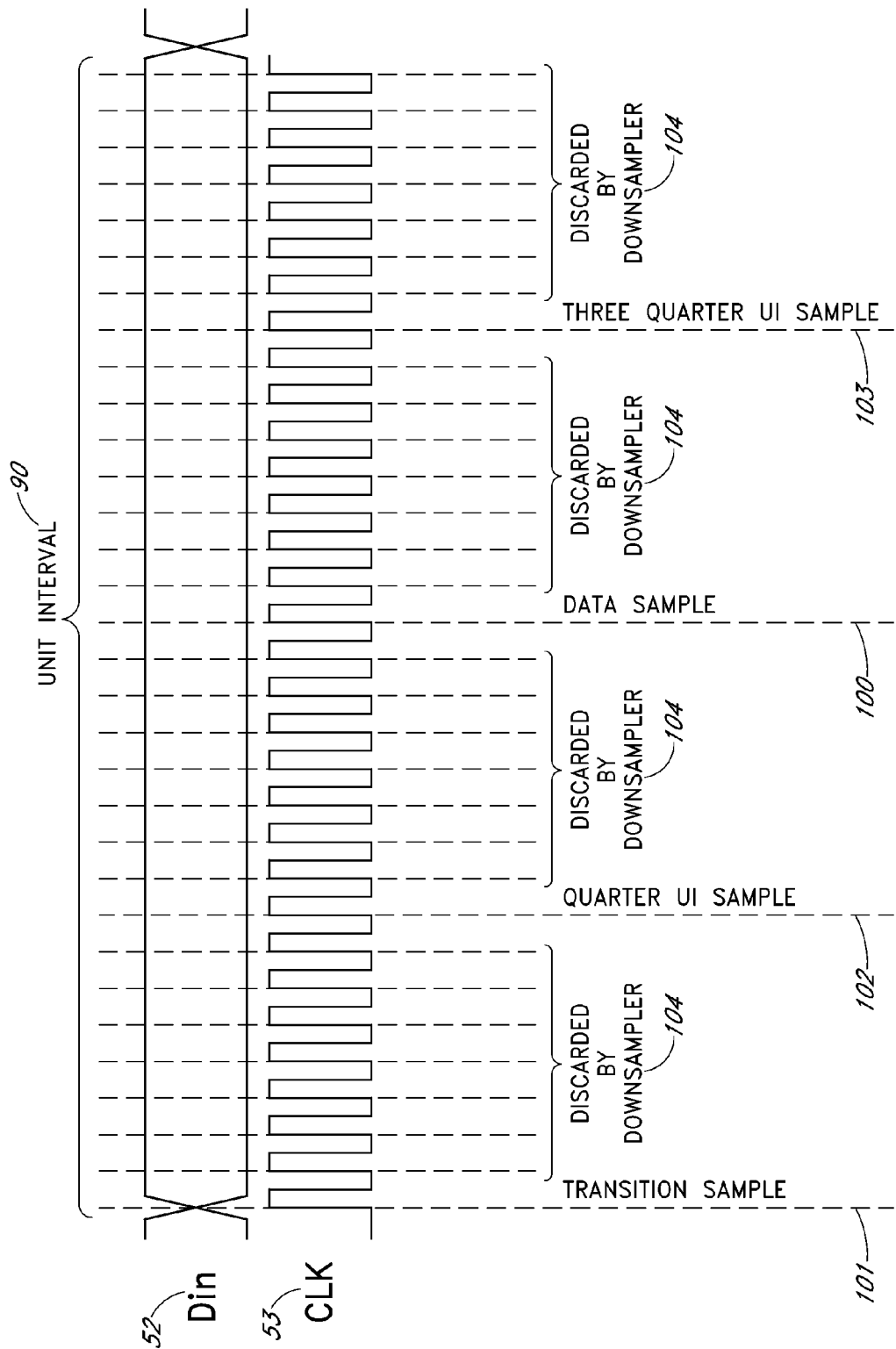
FIG. 6 is a timing diagram illustrating the operation of one embodiment of the sampler and downsampler of FIG. 3 when oversampling by 32.

FIG. 6 is a timing diagram illustrating the operation of one example of the sampler 51 and downsampler 57 of FIG. 3 when oversampling by 32. In the illustrated embodiment, samples are taken from the serial data stream 52 on rising edges of the clock signal 53. This results in 32 samples being taken over a unit interval 90 of the serial data stream 52. As shown, the clock signal 53 transitions at a frequency 32 times that of the data rate when oversampling by 32. It is possible to sample on more phases of the clock signal 53 in order to produce a greater number of samples from which the downsampler 57 selects bits.

The samples include a data sample 100, a transition sample 101, a quarter UI sample 102 and a three-quarter UI sample 103. The data sample is illustrated as being selected by the downsampler from substantially the middle of the UI 90. Furthermore, the transition sample 101 is illustrated as being selected by the downsampler 57 from the beginning of the UI 90, while the quarter UI sample 102 and the three-quarter UI sample 103 are shown as being respectively selected from substantially a quarter into the UI and three-quarters into the UI. Persons of ordinary skill in the art will recognize that the downsampler can be easily configured to select certain samples for use in data recovery and phase and frequency detection from any number of positions into the UI 90. For example, the data sample 100, the transition sample 101, the quarter UI sample 102 and the three-quarter UI sample 103 could be selected to be any of the discarded bits 104.

FIGS. 4 and 6 illustrated exemplary versions of sampling, deserialization, and downsampling in the CDR system of FIG. 3. Skilled artisans will recognize that a variety of intermittent degrees of oversampling can be accomplished, such as full-rate sampling or oversampling by 2, 4, 8, or 16. As discussed above with reference to Table 1, oversampling followed by downsampling increases the flexibility of the CDR system by allowing the clock signal frequency to be decoupled from the data rate, thereby allowing acquisition of the serial data stream over a larger range of data rates. In particular, the acquisition FSM 75 can set the CDR system 50 in a variety of modes which allow the CDR system to function similarly despite drastic changes of the data rate of the serial data stream, as was discussed above with reference to Table 1.

In one embodiment, when oversampling by 2 or more, a single clock signal phase is used to produce samples. When using only a single phase of the clock signal 53 for generating both data samples and samples used for phase and frequency detection, the CDR system is immune to duty cycles variation in the clock signal 53 or errors arising from sampling at more than one phase of the clock signal. Static phase offset is a measure of how far the sampling instance that grabs the data bit is from the middle of the unit interval of the data stream. Errors arising from sampling on more than one phase of the clock signal can lead to static phase offset, while duty cycle distortion can create a dead band in the phase detector transfer function.

Figure 7:
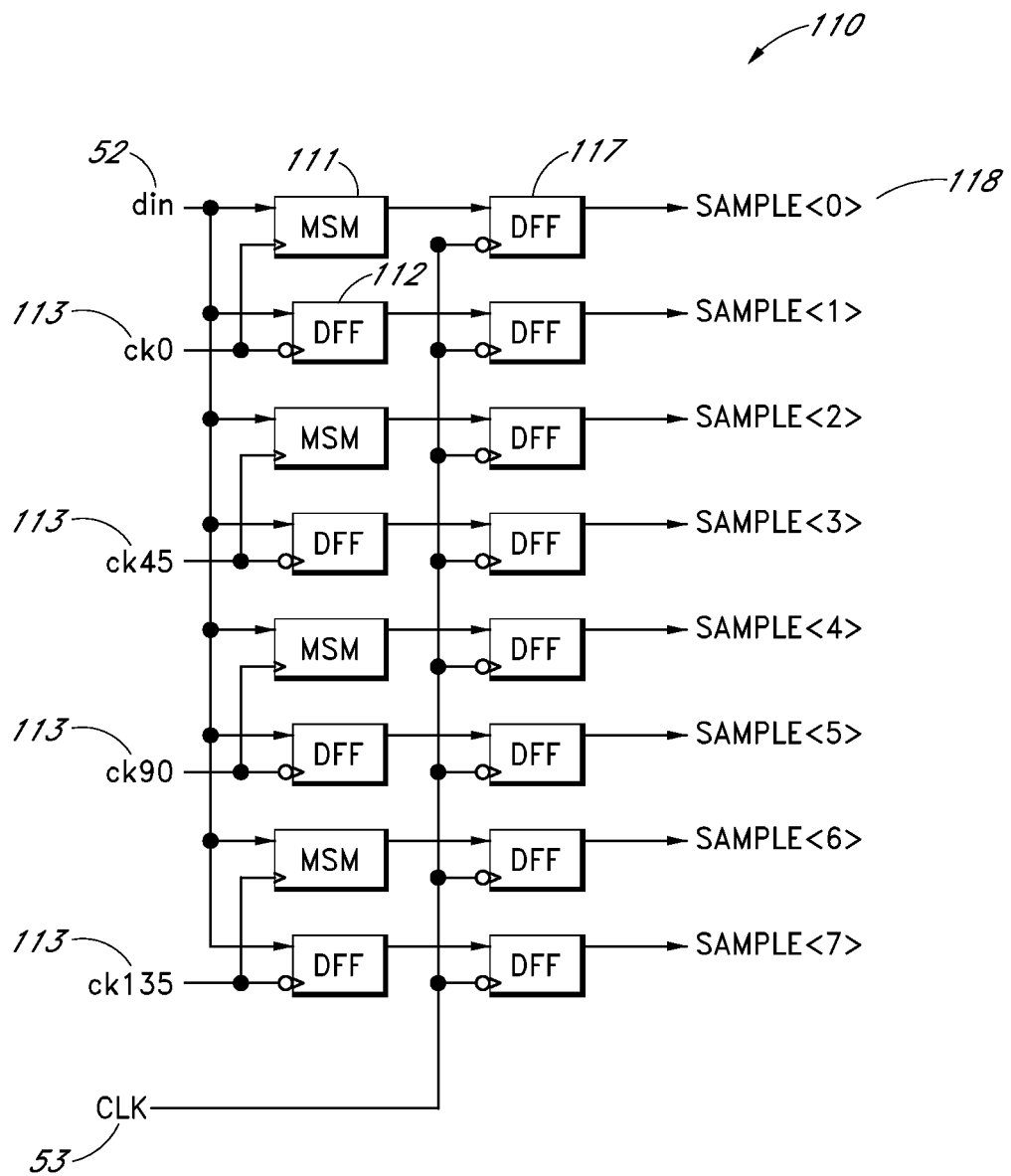
FIG. 7 is a schematic block diagram of one embodiment of the sampler of FIG. 3.

FIG. 7 is a schematic block diagram of one embodiment of the sampler 51 of FIG. 3. The illustrated sampler 110 includes master-slave-master flip-flops or MSMs 111 and master-slave flip-flops or DFFs 112 which receive the serial data stream 52 and various clock signals used for sampling. MSMs 111 and DFFs 112 are well known in the art. In the illustrated sampler 110, phase-shifted versions 113 of the clock signal 53 are presented to the MSMs 111 and DFFs 112 so as to capture samples of the serial data stream 52 on eight phases of the clock signal 53. In the illustrated embodiment, the MSMs 111 and DFFs 112 are configured to capture samples on opposite clock signal transitions, thereby requiring the generation of only four phase-shifted versions 113 of the clock signal 53 to capture the eight samples. In one embodiment, the captured samples are deserialized by a second set of DFFs 117.

With reference back to FIGS. 4 and 6, sampling can occur on one or more phases of the clock signal 53, depending on the mode of operation. For example, with reference to FIG. 4, during half-rate sampling, the sampler 110 can be configured to sample on eight phases of the clock signal. In contrast, as illustrated in FIG. 6, during oversampling by 2 or more, the sampler 110 can be configured to sample on one phase of the clock signal.

Returning to FIG. 7, the sampler 110 can be configured to sample on a variable number of phases depending on the selected mode of operation for the CDR system. In one embodiment, datapaths not associated with samples selected by the downsampler are powered off to conserve power. For example, as illustrated in FIG. 6, when oversampling by four or more, only a single datapath, such as the datapath of a sample 118 is required by the downsampler and the remaining datapaths can be powered off. Skilled artisans will recognize a variety of ways to power off the unused datapaths, such as utilizing clock signal gating or by removing voltage or current from the circuitry.

Figure 8:
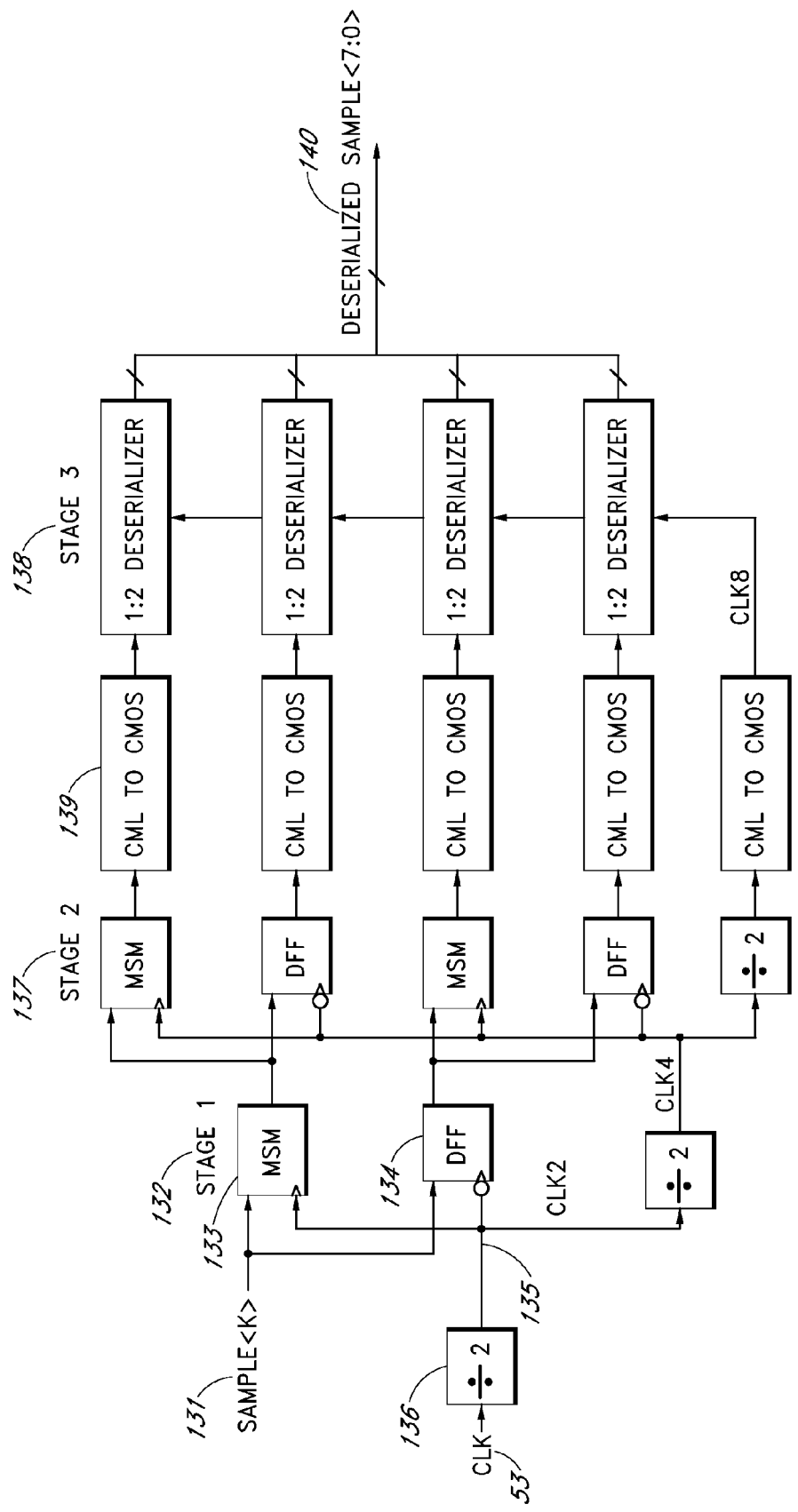
FIG. 8 is a schematic block diagram of one embodiment of the deserializer of FIG. 3.

FIG. 8 is a schematic block diagram of one example of the deserializer 55 of FIG. 3. The illustrated deserializer 130 is implemented using a binary tree. However, the deserializer 130 can be implemented in other ways. A sample 131 from the sampler 51 (FIG. 3) is provided as input to a first deserialization stage 132. The first deserialization stage can include a MSM 133 and a DFF 134 configured to receive a divided clock signal 135. The divided clock signal 135 can be generated using a divide-by-two circuit 136 receiving the clock signal 53. In the illustrated embodiment, the MSM 133 and DFF 134 are configured to capture samples on opposite clock signal transitions, thereby deserializing the sample 131 by a factor of two. In an alternative embodiment, the deserializer 130 can include a second deserialization stage 137 and third deserialization stage 138, to further deserialize the sample 131. In some embodiments, the deserializer includes a CML to CMOS converter 139. In particular, the sampled data can transition at data rates in excess of what is possible to implement with CMOS circuitry at the current process node. Accordingly, circuits operating off the clock signal 53 can be implemented using CML logic, while circuits operating off the logic clock signal 59 can be implemented using static CMOS logic.

The deserializer 130 deserializes the sample 131 to produce a deserialized sample 140. In implementations in which the sampler produces multiple bit streams, such as in the sampler 110 shown in FIG. 7, each bit stream can have its own deserializer 130. Although the illustrated deserializer 130 deserializes by a factor of 8, persons of ordinary skill in the art will recognize that other degrees of deserialization are possible, such as by a factor of 4 or 10.

Figure 9:
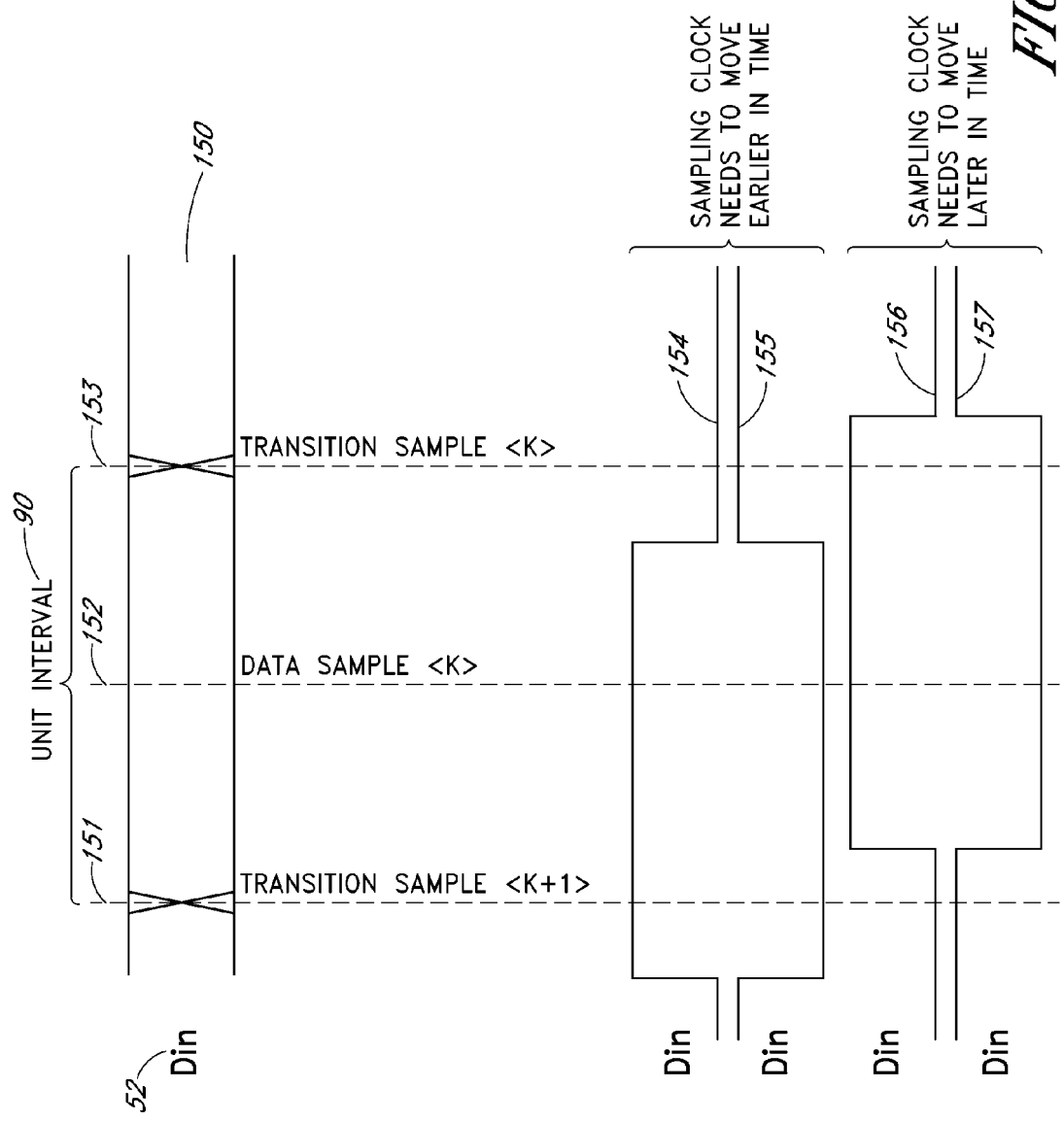
FIG. 9 is a timing diagram illustrating the operation of one embodiment of the phase detector of FIG. 3.

FIG. 9 is a timing diagram illustrating the operation of one example of the phase detector 70 of FIG. 3. As illustrated by an ideal lock condition timing diagram 150, during a lock condition, the transition samples are taken at the beginning of the UI 90 of the serial data stream 52 while the data samples are taken from substantially halfway into the UI. However, prior to lock, it is possible for the sampling clock signal to be early or late. FIG. 9 illustrates the ideal lock condition timing diagram 150, and various timing scenarios where the frequency of the sampling clock signal is locked but where the phase of the sampling clock signal is not.

With reference back to FIG. 3, the illustrated phase detector 70 receives the deserialized data samples 62 and the deserialized transition samples 63 and produces a PD error signal 85. The deserialized data samples 62 and deserialized transition samples 63 can be one or more bits. FIG. 9 illustrates a first transition sample 151, a data sample 152 and a second transition sample 153 of the serial data stream 52 before deserialization.

In one embodiment, the phase detector 70 produces a PD error signal 85 which includes a frequency pump up and a frequency pump down signal, which are operable to pump up or down, respectively, the frequency of the oscillator. As illustrated in FIG. 9, two conditions can exist for each bit of the data sample 152 in which the sampling clock signal can need to move earlier in time. As persons skilled in the art will recognize, moving the sampling clock signal earlier in time is equivalent to a frequency pump up, while moving the sampling clock signal later in time is equivalent to a frequency pump down. If deserialized data samples are denoted as D[k] and deserialized transition samples as T[k], a first pump up condition 154 can be expressed as D[k]·~T[k] and a second pump up condition 155 can be expressed as ~D[k]·T[k]. Similarly, a first pump down condition 156 can be expressed as ~T[k+1]·D[k] and a second pump down condition 157 can be expressed as T[k+1]·~D[k]. If there are N bits in deserialized data sample 62, these pump up and pump down conditions can be evaluated for k from 0 to N−1, where T[N] is the stored value of T[0] from the previous deserialized transition sample 63. Persons of ordinary skill of the art will recognize that T[8] can be obtained by numerous ways, including capturing the first bit of the previous deserialized transition sample with a flip-flop.

In one embodiment, the phase detector 70 of FIG. 3 can be implemented so that a user can select whether phase errors are computed on rising data transitions, falling data transitions, or both rising and falling data transitions. For example, the pump up condition for a rising data transition corresponds to the second pump up condition 155, while the pump down condition for a rising data transition corresponds to the first pump down condition 157. Analogously, the pump up condition for a falling data transition corresponds to the first pump up condition 154, while the pump down condition for a falling data transition correspond to the second pump down condition 156. In one embodiment the PD error signal 85 is a difference between the sum of the pump up signals and the sum of the pump down signals.

Figure 10:
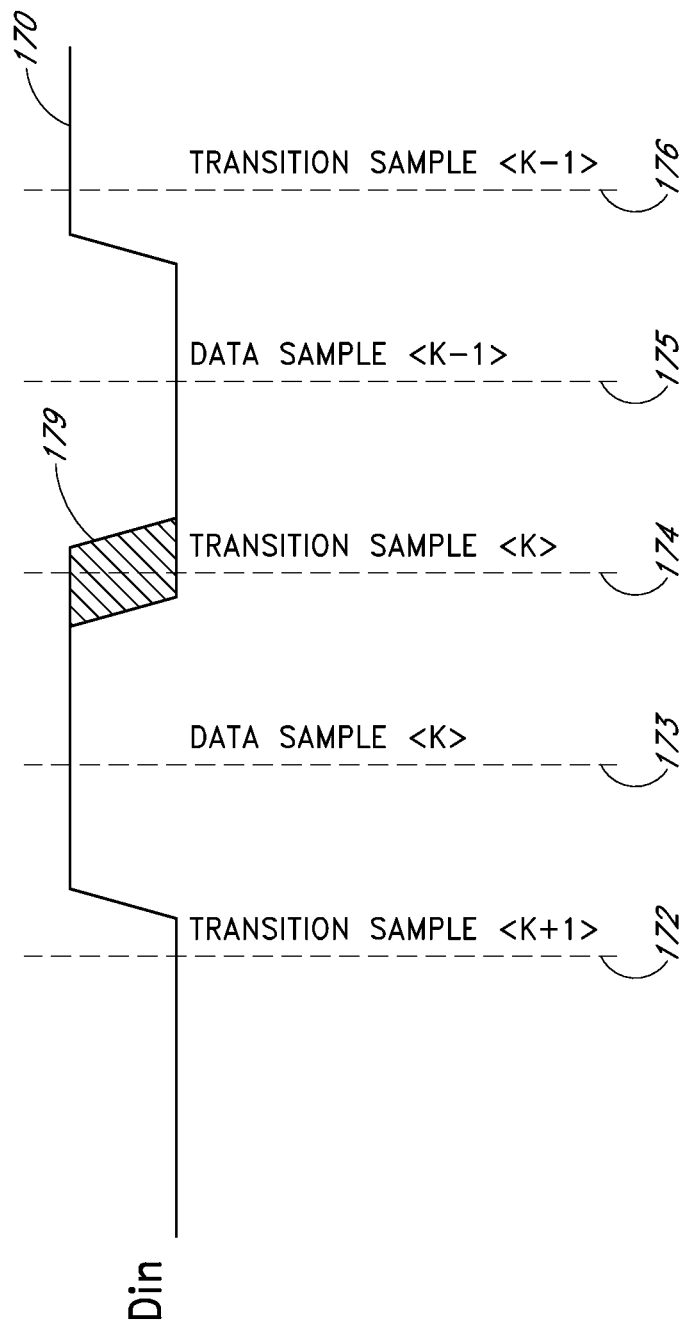
FIG. 10 is a timing diagram illustrating the operation of one embodiment of the coarse frequency detector of FIG. 3.

FIG. 10 is a timing diagram illustrating the operation of the coarse frequency detector 72 of FIG. 3 according to one embodiment. In one embodiment to be described below, the coarse frequency detector 72 drives the sample rate frequency higher until it is within +/−50% of the data rate. At this point, the rotational frequency detector 71 can be used to drive the CDR system 50 to a lock condition, as will be discussed with reference to FIGS. 11-14 below.

In one embodiment of the coarse frequency detector 72, the coarse frequency detector 72 looks for three data transitions within two sampling periods as an indication that the sampling rate is too low. With reference back to FIG. 3, the illustrated coarse frequency detector 72 receives the deserialized data samples 62 and the deserialized transition samples 63 and produces a CFD error signal 80. The deserialized data samples 62 and deserialized transition samples 63 can be one or more bits. The data pattern 170 illustrates an example of the coarse frequency detector 72 looking for three transitions within two sampling periods. FIG. 10 illustrates a first transition sample 172, a first data sample 173, a second transition sample 174, a second data sample 175, and a third transition sample 176 of the serial data stream before deserialization.

One embodiment of the coarse frequency detector 72 can have the following configuration. If a signal indicating three transitions within two sampling periods is denoted FUP[k], the deserialized data samples are denoted as D[k], and the deserialized transition samples are denoted as T[k], then three transitions within two sampling periods can be determined by a logic equation expressed by Equation 1 below.

$$FUP[k]=(T[k+1] \text{ XOR } D[k])\cdot(D[k-1] \text{ XOR } T[k-1])\cdot(D[k] \text{ XOR } D[k-1]) \quad \text{Equation 1}$$

If there are N bits in deserialized data sample 62, the logic equation can be evaluated for k from 1 to N−1, where T[N] is the stored value of T[0] from the previous deserialized transition sample 63. The results of the logic equation could be used to produce the CFD error signal 80. For example, the results could be inputted to an OR operation to produce the CFD error signal 80.

The logic equation above is advantageous because it avoids the use of the transition sample 174, the use of which can result in errors if duty cycle distortion 177 is present. Skilled artisans will recognize that other implementations of a coarse frequency detector are possible, including alternative designs which look for three transitions within two sampling periods using a different logic equation. For example, a different logical equation would result if the starting and ending boundaries were defined as data samples rather than as the transition sample 172 and the transition sample 176.

In one embodiment, the CFD error signal 80 is configured to increment the counter of the acquisition finite state machine 75 if any of the frequency up bits in the above equation is evaluated to be true.

Although the discussion above has described the coarse frequency detector 72 in a particular manner, persons of ordinary skill in the art will recognize that there are other ways to implement a coarse frequency detector, as is well known in the art.

With reference back to FIG. 1, the conventional rotational frequency detector 20 typically receives samples from the sampler 11 on a bit-by-bit basis, as they are sampled from the serial data stream 12. For high-speed clock and data recovery, the conventional rotational frequency detector 20 is typically a custom circuit designed using a high-speed logic family, such as CML. The necessity of using CML or another high-speed logic family for the conventional rotational frequency detector 20 arises from the architectural constraint that the rotational frequency detector 20 can operate at the frequency of the sampling clock signal 13.

Additionally, the conventional rotational frequency detector 20 typically has no gain when the sampling rate is two-thirds the data rate or lower. In wide-band applications, gain can be desirable over a wide range of sampling rates. For example, at low sampling rates, gain can be used to detect loss-of-lock and to initiate a new frequency acquisition, as will be described in further detail below.

There is a need for a rotational frequency detector that can operate at a frequency less than that of the sampling clock. Moreover, there is a need for a rotational frequency detector than can be designed using a conventional static digital CMOS circuit design flow, even when performing high-speed clock and data recovery. Additionally, there is a need for a rotational frequency detector architecture comprising simple building blocks with well-controlled timing which can be scaled in number to achieve the desired tradeoff between operating frequency and latency. Furthermore, there is a need for a rotational frequency that can achieve gain over a wide band of sampling rates in a simple manner.

Figure 11:
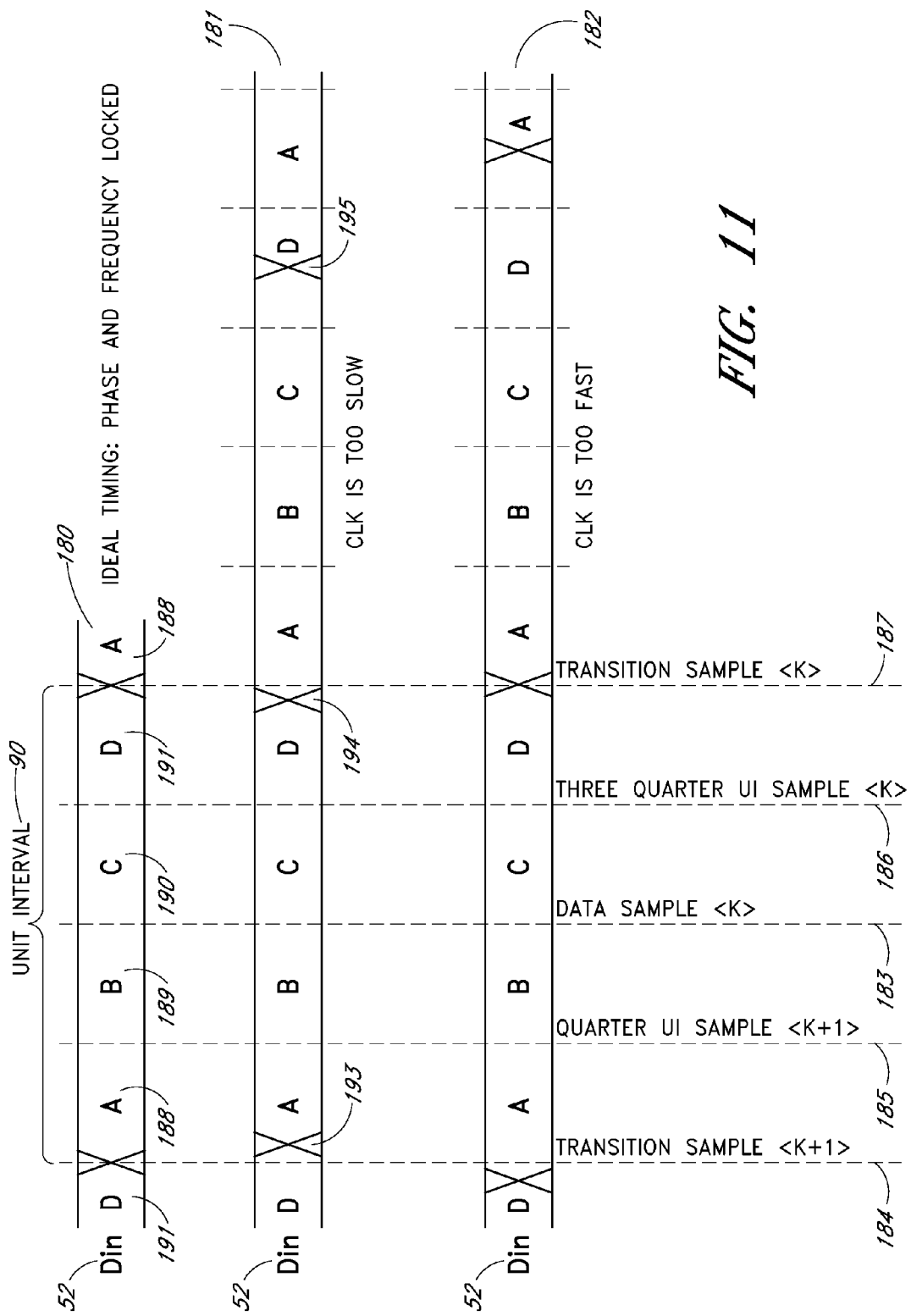
FIG. 11 is a timing diagram illustrating the operation of one embodiment of the rotational frequency detector of FIG. 3.

FIGS. 11-14 illustrate one embodiment of the rotational frequency detector for use in the CDR system of FIG. 3. FIG. 11 is a timing diagram illustrating the operation of one example of the rotational frequency detector of FIG. 3. As illustrated by an ideal lock condition timing diagram 180, during a lock condition the data samples, transition samples, quarter UI samples, and three-quarter UI samples hold a specific relationship to the UI 90 of the serial data stream 52. For example, during a lock condition, a data sample 183 is taken from substantially halfway into the UI and a transition sample 184 is taken from substantially the beginning of the UI of the serial data stream 52. Similarly, during a lock condition, a quarter UI sample 185 is taken from substantially a quarter of the way into the UI, while a three-quarter UI sample 186 is taken from substantially three-quarters of the way into the UI. Persons of ordinary skill in the art will recognize that other choices for sampling points taken into the UI during a lock condition are possible.

As illustrated in FIG. 11, the region between the transition sample 184 and the quarter UI sample 185 can be labeled as an A quadrant 188. Similarly, the region between the quarter UI sample 185 and the data sample 183, the region between the data sample 183 and the three-quarter UI sample 186, and the region between the three-quarter UI sample 186 and the transition sample 187 can be labeled as a B quadrant 189, a C quadrant 190, and a D quadrant 191, respectively. During a lock condition, serial data transitions fall on the boundary between the A quadrant 188 and the D quadrant 191. However, as illustrated by a slow clock signal timing diagram 181, when the clock signal is too slow, the quadrant in which the serial data transition occurs in is not always on the boundary between the A quadrant 188 and D quadrant 191. In particular, when the clock signal is too slow, the serial data transition can move from a first position 193, to a second position 194, and then to a third position 195. As persons of ordinary skill in the art will recognize, the progression of the serial data transition progresses from D→C→B→A as the timing is further played out in time. Similarly, as illustrated by a fast clock signal timing diagram 182, when the clock signal is too fast, the quadrant in which the serial data transition occurs in progresses from A→B→C→D as the timing is further played out in time.

Figure 12:
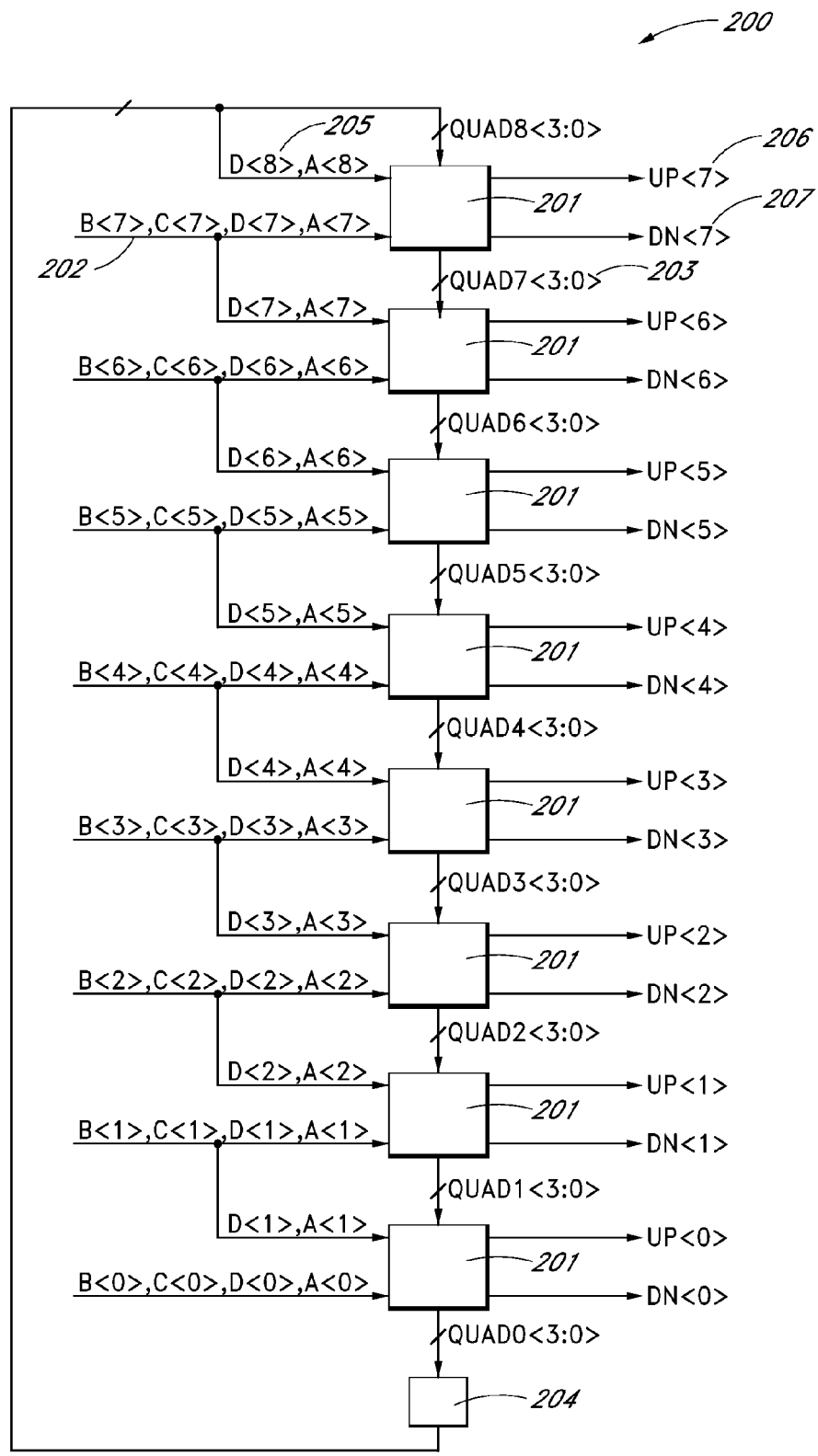
FIG. 12 is a schematic block diagram illustrating one embodiment of the rotational frequency detector of FIG. 3.

FIG. 12 is a schematic block diagram illustrating one example of the rotational frequency detector 71 of FIG. 3. With reference to FIGS. 11 and 12, the illustrated rotational frequency detector 200, operates by looking for C→B or B→C quadrant progressions by analyzing the sequence of quadrants with transitions. For example, if there was a transition in the C quadrant 190 followed by a transition in the B quadrant 189, the rotational frequency detector 200 can produce an error signal indicating the clock signal is too slow. Similarly, absent a complexity related to aliasing discussed below with reference to FIG. 13, if there was a transition in the B quadrant 189 followed by a transition in the C quadrant 190, the rotational frequency detector 200 could produce an error signal indicating the clock signal is too fast.

In the embodiment illustrated in FIG. 12, the rotational frequency detector (RFD) 200 includes at least one rotational frequency detector processing element or RFD processing element 201. Although the illustrated rotational frequency detector 200 is shown as having eight RFD processing elements, this selection is merely illustrative, and persons of ordinary skill in the art will recognize that any number or variety of RFD processing elements could be used in implementing a rotational frequency detector. In particular, the number of RFD processing elements 201 can be related to the number of data, transition, quarter UI, and three-quarter UI samples. For example, with reference back to FIG. 5, if each of the deserialized data, transition, quarter UI, and three-quarter UI samples include 16 bits, there can be sixteen RFD processing elements 201, each one analyzing its respective A, B, C and D quadrants.

The number of RFD processing elements can be selected to achieve the desired balance between latency and operating frequency of the rotational frequency detector. Each RFD processing element 201 can be configured to receive and analyze samples corresponding to an A, B, C and D quadrant of a different sampling period, as will be described in further detail below. By increasing the number of RFD processing elements 201, the maximum frequency at which each RFD processing element 201 operates can be decreased, which permits implementation with a slower-speed logic family, such as CMOS. Including k RFD processing elements configured to receive samples corresponding to k sampling periods can reduce the operating frequency of the rotational frequency detector by a factor k. For example, including 16 RFD processing elements in a CDR system with a peak data rate of about 12 Gbps can reduce the required peak operating frequency of the rotational frequency detector from about 12

GHz to about 750 MHz. Accordingly, inclusion of a sufficient number of RFD processing elements can reduce the maximum operating frequency of the rotational frequency detector to the point that a conventional static digital CMOS circuit design flow can be used to design the rotational frequency detector, even when performing high-speed clock and data recovery. Thus, the illustrated rotational frequency detector 200 can be scaled by including a sufficient number of RFD processing elements to achieve the desired tradeoff between operating frequency and latency.

With reference now to FIG. 11, if deserialized data samples are denoted as D[k], deserialized transition samples are denoted as T[k], deserialized quarter UI samples are denoted as Q[k] and deserialized three-quarter UI samples are denoted as TQ[k], the following logic operations could be used to determine whether a transition occurred in the various quadrants. In particular, a transition in the B quadrant 189 can be determined by evaluating the operation D[k] XOR Q[k+1]. A transition in the C quadrant 190 can be determined by evaluating the operation TQ[k] XOR D[k]. A transition in the D quadrant 191 can be determined by evaluating the operation T[k] XOR TQ[k]. A transition in the A quadrant 188 can be determined by evaluating the operation Q[k] XOR T[k]. If there are N bits in each of the deserialized samples, the equation above can be evaluated for k from 0 to N−1, where Q[N] is the stored value of Q[0] from the previous deserialized quarter UI sample 64.

With reference back to FIG. 12, the RFD processing element 201 receives a quadrant hit signal 202 which indicates in which quadrants transitions have occurred for the given set of bits. In particular, if there are N bits in each of the deserialized samples, each of the N quadrant hit signals 202 indicates if there was a transition in its respective A quadrant, B quadrant, C quadrant, and D quadrant. One way to determine whether or not there was a transition in a given quadrant is by implementing the logic equations provided above in hardware.

A last quadrant hit signal 203 is also provided to each RFD processing element 201. In the illustrated embodiment, the last quadrant hit signal 203 represents whether there was a transition in the A quadrant, B quadrant, C quadrant, and D quadrant the last time there was a data transition. In contrast to the quadrant hit signal 202, which indicates hits to the quadrants in the current deserialized samples, the last quadrant hit signal 203 indicates hits to the quadrants the last time there was a data transition. Comparing current and last quadrant hit signals aids the RFD processing element 201 in finding B→C and C→B quadrant progressions.

If there are N bits in each of the deserialized samples, each of the N last quadrant hit signals 203 indicates if there was a transition in its respective A quadrant, B quadrant, C quadrant, and D quadrant the last time there was a data transition. For N−1 of the RFD processing elements, the last quadrant hit signal 203 comes from the nearest upstream RFD processing element. However, the RFD processing element furthest upstream receives the last quadrant hit signal 203 from registers 204, which store last quadrant hit signal information determined from the 0th position of the previous deserialized samples.

With continuing reference to FIG. 12, each RFD processing element 201 also receives an upstream quadrant hit signal 205, which is a portion of the quadrant hit signal 203 associated with the nearest upstream RFD processing element. This signal is needed to properly perform a frequency pump down at certain sampling frequencies that might result in aliasing, as will be discussed below with reference to FIGS. 13-14. The RFD processing element furthest upstream receives the upstream quadrant hit signal 205 from the registers 204, which store upstream quadrant hit signal information determined from the 0th position of the previous deserialized samples.

In the illustrated embodiment, each RFD processing element 201 outputs a frequency pump up signal 206 and frequency pump down signal 207. As discussed above, the exemplary rotational frequency detector 200 operates by looking for quadrant progressions from C→B or from B→C by analyzing the sequence of quadrants with transitions. For example, with reference back to FIG. 11, if there was a transition in the C quadrant 190 followed by a transition in the B quadrant 189, the rotational frequency detector 200 could produce an error signal indicating the clock signal is too slow. The pump up signal 206 and pump down signal 207 indicate whether a qualifying quadrant progression from C→B or from B→C has occurred with respect to the deserialized samples corresponding to the given RFD processing element. The details of such a determination will be discussed below with reference to FIGS. 13-14.

Figure 13:
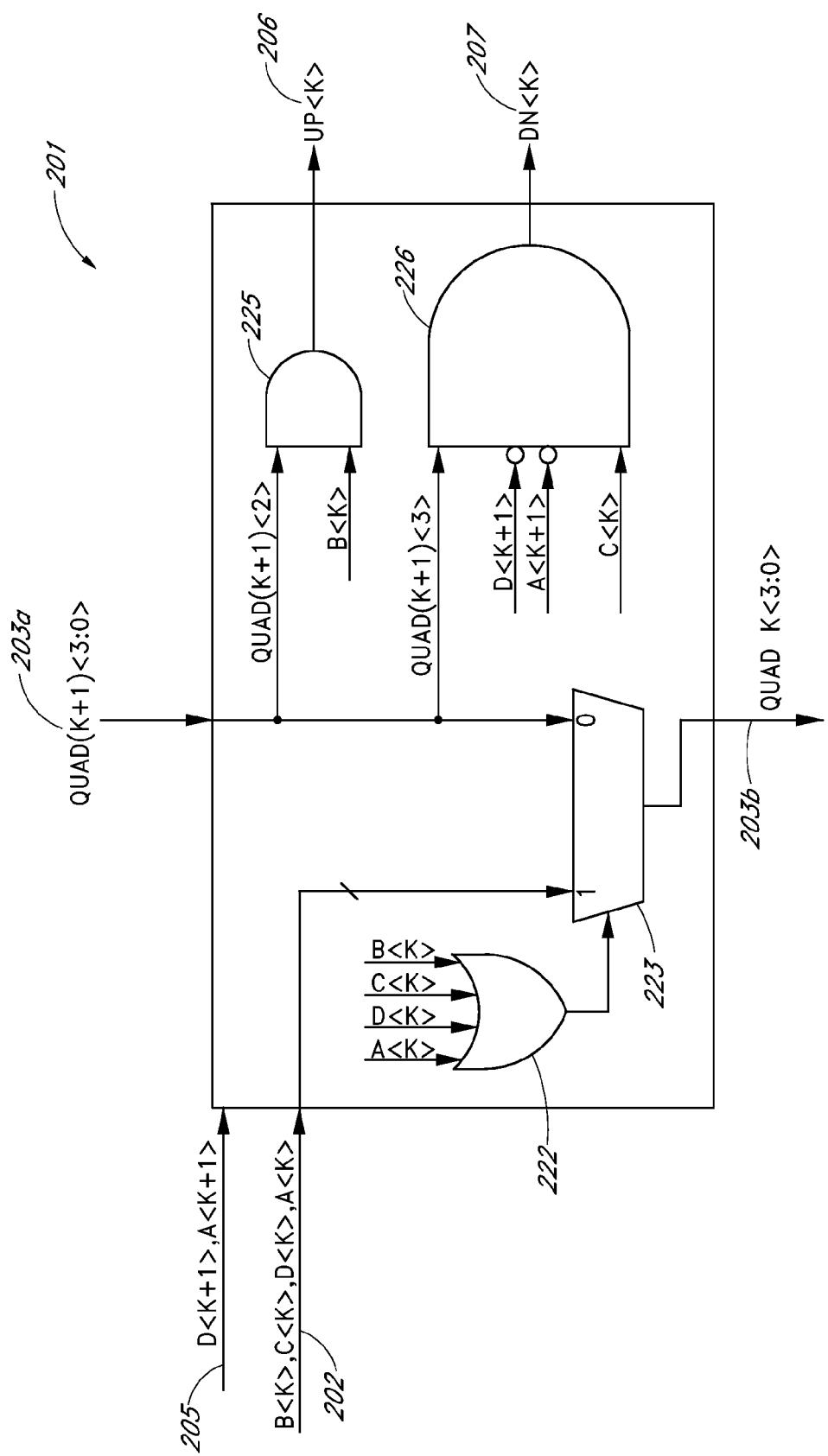
FIG. 13 is a schematic block diagram illustrating one embodiment of the rotational frequency detector processing element of FIG. 12.

FIG. 13 is a schematic block diagram illustrating one embodiment of the RFD processing element 201 of FIG. 12. The RFD processing element 201 receives the quadrant hit signal 202, the upstream quadrant hit signal 205, and a last quadrant hit signal 203a. In the illustrated embodiment, the last quadrant hit signal 203a is four bits, with bit <3> defining if there was a hit to the quadrant B the last time there was a data transition, with bit <2> defining if there was a hit to the C quadrant the last the time there was a data transition, with bit <1> defining if there was a hit to the D quadrant the last time there was a data transition, and with bit <0> defining if there was a hit to the A quadrant the last time there was a data transition.

The quadrant hit signal 202 has bits <3>, <2>, <1> and <0>, respectively, defining whether there is a current transition in the B, C, D and A quadrants in the deserialized samples corresponding to the RFD processing element 201. For example, with reference back to FIG. 5, if there were 16 bits in each of deserialized data, transition, quarter UI, and three-quarter UI samples, there can be 16 A quadrants, 16 B quadrants, 16 C quadrant, and 16 D quadrants. Thus, there could be 16 RFD processing elements, each analyzing transitions in A, B, C and D quadrants corresponding to the deserialized samples of each RFD processing element. Although in the embodiment being described the rotational frequency detector operates on deserialized samples, a RFD processing element that is upstream of another is operating on samples taken earlier in time.

With reference back to FIG. 13, a multiplexer control gate 222 performs an OR operation of the bits of the quadrant hit signal 202. If any of the bits are true, thus indicating a hit in the A, B, C or D quadrant corresponding to the RFD processing element, a multiplexer 223 selects the quadrant hit signal 202 to be provided as an output as the downstream last quadrant hit signal 203b for the downstream RFD processing element. This corresponds to the situation in which the upstream last quadrant hit signal no longer logically represents information describing the last quadrant hit for the downstream RFD processing element. In particular, as described above, a RFD processing element that is upstream of another is operating on samples taken earlier in time. Thus, when any of the bits of the quadrant hit signal 202 are true, the multiplexer 223 selects the quadrant hit signal 202 to become the downstream last quadrant hit signal 203b for the downstream RFD processing element. If none of the bits of the quadrant hit signal 202 are true, then the upstream last quadrant hit signal 203a still logically represents the last quadrant hit, so the mux 223 will select the upstream last quadrant hit signal 203a to be outputted as the downstream last quadrant hit signal 203b.

With continuing reference to FIG. 13, pump up logic 225 produces a frequency pump up signal 206 when bit <2> of the last quadrant hit signal and the bit of the quadrant hit signal 202 indicating a hit to the B quadrant are both true. This corresponds to the situation in which the last transition was in the C region, and the current transition is in the B region. As illustrated in FIG. 11, if there was a transition in the C quadrant 190 followed by detecting a transition in the B quadrant 189, the clock is too slow. Accordingly, when this situation is detected, the RFD processing element activates a frequency pump up signal 206.

Detecting a frequency pump down is a more complicated proposition. If the same reasoning was followed in defining the frequency pump down logic as was followed in defining the frequency pump up logic, a pump down can be determined by detecting a transition in the B quadrant followed by detecting a transition in the C quadrant. This can correspond to an AND operation of the <1> bit of the last quadrant hit signal 203 and the bit of the quadrant hit signal 202 indicating a hit to the C quadrant.

With continuing reference to FIG. 13, there are two addition inputs to pump down logic 226. At a sampling rate of two-thirds the data rate or lower, aliasing can lead to transitions in the D or A quadrants of the quadrant hit signal 202. In particular, when operating at two-thirds the data rate or lower, persons of ordinary skill in the art will recognize that sampling is not being performed at the Nyquist rate and aliasing can result. Accordingly, this could result in the RFD processing element indicating that a pump down should take place when in fact a pump up should be the correct operation.

In order to avoid this problem, the pump down logic 226 checks for transitions in the D and A quadrants using the quadrant hit signal 202. Only if no such transitions have occurred, will the frequency pump down 207 error signal be activated. Accordingly, when operating at about two-thirds the data rate or lower, ensuring that no transition has occurred in the D or A quadrant prevents an erroneous activation of the frequency pump down error signal. This results in improved rotation frequency performance when sampling at frequencies less than about two-thirds of the data rate. Thus, with only a small increase in complexity of the pump down logic 226, the rotational frequency detector 200 can achieve gain over a wider band of sampling rates.

Figure 14:
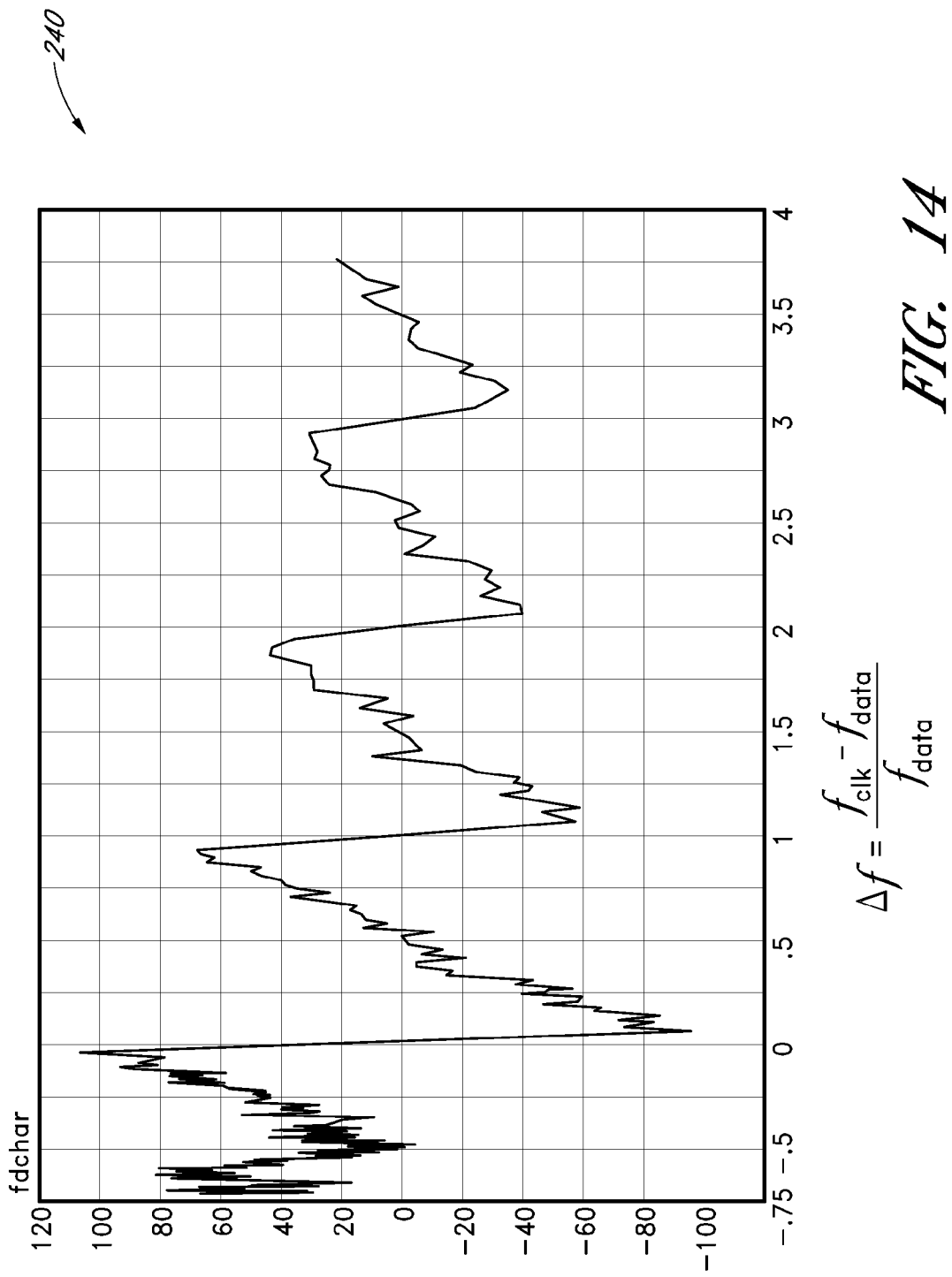
FIG. 14 is a simulated transfer function diagram of the rotational frequency detector of FIGS. 12 and 13.

FIG. 14 is a simulated transfer function diagram of the rotational frequency detector of FIGS. 12 and 13. As persons of ordinary skill in the transfer function 240 represents the gain of the rotational frequency detector for various normalized differences between the sampling frequency and the data rate or Δf. While conventional rotational frequency detectors have zero gain when Δf is below about −0.33, the rotational frequency detector of FIGS. 12 and 13 has gain for Δf below about −0.33. The gain when operating for values of Δf between about −0.5 and about −0.33 comes from preventing an erroneous activation of the frequency pump down signal by ensuring that no transition has occurred in the D or A quadrant.

The improvement in the rotational frequency detector ensures that the CDR system of FIG. 3 will lock. A CDR system is considered locked when Δf in FIG. 14 is zero. When far from a lock condition, the rotational frequency detector 71 can be disabled, and the coarse frequency detector 72 can be used to bring the CDR system 50 near a lock condition. At this point, the coarse frequency detector 72 can be disabled, and the rotational frequency detector 71 can be enabled. If the coarse frequency detector sets the sample clock signal at too fast a frequency, the CDR system can lock at a higher harmonic, such as where Δf equals one in FIG. 14. If the coarse frequency detector sets the sample clock signal at too low of a frequency, the CDR system may not lock as the sample clock signal may be at a frequency below the pull-in range of the rotational frequency detector.

As is well known in the art, conventional rotational frequency detectors have no gain when Δf is less than about −0.33. Accordingly, in a conventional CDR system, the coarse frequency detector should bring Δf above about −0.33 or the CDR system may not lock. However, the coarse frequency detector must not overshoot the data frequency by too much, or the CDR system can lock at a higher harmonic as described above. Accordingly, the coarse frequency detector in conventional CDR systems should operate within tight margins.

When the rotational frequency detector described in FIGS. 12-13 is used, the margin for error of the coarse frequency detector is improved. In particular, because the rotational frequency detector has gain when Δf is greater than about −0.5, the coarse frequency detector need only bring the clock signal frequency to approximately 50% of the sample rate. Accordingly, the design constraints of the coarse frequency detector are relaxed and the CDR architecture is simplified.

Even in an architecture lacking a coarse frequency detector, the pull-in range of the rotational frequency detector is improved when using the design described in FIGS. 12-13 because gain exists when Δf is between about −0.5 and about −0.33. This results in a CDR architecture in which acquisition can be achieved over a larger range of data rates. As illustrated in FIG. 14, the rotational frequency detector has gain for Δf below about −0.5. However, the rotational frequency detector also has a null at about −0.5, which may prevent frequency acquisition for values of Δf less than about −0.5. Despite the presence of the null at about −0.5, the gain below about −0.5 can be used for purposes besides frequency acquisition. In one embodiment, the gain when Δf is less than about −0.5 can be used to serve as a loss-of-lock detector. In this embodiment, the non-zero gain below about −0.5 can be used to detect loss-of-lock and initiate a new frequency acquisition.

The rotational frequency detector, phase detector, and coarse frequency detector described above produce error signals expressed with relatively simple logic equations. Furthermore, by adding a deserializer, the maximum frequency at which the phase and frequency detectors operate is relaxed, and the circuits can be designed using a static CMOS digital design flow. Because the samples can be aligned by deserialization and the timing of the static CMOS circuits can be matched by using well-known static CMOS digital design techniques, phase alignment between the phase and frequency detectors is well-controlled and cycle slip detection is improved.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A clock and data recovery system comprising:
a sampler configured to sample a serial data stream having a plurality of data periods on at least one phase of a clock signal, wherein the sampler is configured to extract samples from the serial data stream, the samples comprising a data sample of one or more bits in the serial data stream and a transition sample of the one or more bits, wherein when the clock and data recovery system is in a locked state, the data sample is taken from a first interval into a data period and the transition sample is taken from a second interval into the data period, wherein the second interval is different from the first interval;
a deserializer configured to convert at least one bit of the data sample to a deserialized data sample, and to convert at least one bit of the transition sample to a deserialized transition sample;
a phase detector configured to receive the deserialized data sample and the deserialized transition sample, and to generate a phase error signal based at least partly on the deserialized data sample and the deserialized transition sample; and
a frequency detector configured to receive the deserialized data sample and the deserialized transition sample, and to generate a frequency error signal based at least partly on the deserialized data sample and the deserialized transition sample,
wherein the data sample comprises at least two bits taken from at least two data periods and the transition sample comprises at least two bits taken from the at least two data periods, and the deserializer is further configured to convert the at least two bits of the data sample to a deserialized data sample, and to convert the at least two bits of the transition sample to a deserialized transition sample.

2. The clock and data recovery system of claim 1, wherein the deserialized data sample comprises at least eight bits.

3. The clock and data recovery system of claim 2, wherein the deserialized data sample comprises at least ten bits but no more than sixteen bits.

4. The clock and data recovery system of claim 1, further comprising a controlled oscillator configured to generate the clock signal at least partly in response to one or more of the phase error signal and the frequency error signal.

5. A clock and data recovery system comprising:
a sampler configured to sample a serial data stream having a plurality of data periods on at least one phase of a clock signal, wherein the sampler is configured to extract samples from the serial data stream, the samples comprising a data sample of one or more bits in the serial data stream and a transition sample of the one or more bits, wherein when the clock and data recovery system is in a locked state, the data sample is taken from a first interval into a data period and the transition sample is taken from a second interval into the data period, wherein the second interval is different from the first interval;
a deserializer configured to convert at least one bit of the data sample to a deserialized data sample, and to convert at least one bit of the transition sample to a deserialized transition sample;
a phase detector configured to receive the deserialized data sample and the deserialized transition sample, and to generate a phase error signal based at least partly on the deserialized data sample and the deserialized transition sample; and
a frequency detector configured to receive the deserialized data sample and the deserialized transition sample, and to generate a frequency error signal based at least partly on the deserialized data sample and the deserialized transition sample,
wherein the sample extracted from the serial data stream further comprises a quarter unit interval sample of the one or more bits and a three-quarter unit interval sample of the one or more bits, and wherein the deserializer is further configured to convert at least one bit of the quarter unit interval sample to a deserialized quarter unit interval sample and convert at least one bit of the three-quarter unit interval sample to a deserialized three-quarter unit interval sample, and wherein when the clock and data recovery system is in the locked state, the quarter unit interval sample is taken from substantially a quarter into the data period, and the three quarter unit interval sample is taken from substantially three-quarters into the data period.

6. The clock and data recovery system of claim 5, wherein the data sample is taken from substantially halfway into the data period and wherein the transition sample is taken from substantially the beginning of the data period.

7. The clock and data recovery system of claim 5, wherein the frequency detector comprises a rotational frequency detector, wherein the rotational frequency detector is configured to generate the frequency control signal based at least partly upon the deserialized data sample, the deserialized transition sample, the deserialized quarter unit interval sample, and the deserialized three-quarter unit interval sample.

8. The clock and data recovery system of claim 7, wherein the rotational frequency detector is implemented in hardware in a complementary metal oxide semiconductor (CMOS) configuration.

9. A clock and data recovery system comprising:
a sampler configured to sample a serial data stream having a plurality of data periods on at least one phase of a clock signal, wherein the sampler is configured to extract samples from the serial data stream, the samples comprising a data sample of one or more bits in the serial data stream and a transition sample of the one or more bits, wherein when the clock and data recovery system is in a locked state, the data sample is taken from a first interval into a data period and the transition sample is taken from a second interval into the data period, wherein the second interval is different from the first interval;
a deserializer configured to convert at least one bit of the data sample to a deserialized data sample, and to convert at least one bit of the transition sample to a deserialized transition sample;
a phase detector configured to receive the deserialized data sample and the deserialized transition sample, and to generate a phase error signal based at least partly on the deserialized data sample and the deserialized transition sample;
a frequency detector configured to receive the deserialized data sample and the deserialized transition sample, and to generate a frequency error signal based at least partly on the deserialized data sample and the deserialized transition sample; and
a downsampler configured to select the at least one bit of the data sample to be converted to the deserialized data sample and the at least one bit of the transition sample to be converted to the deserialized transition sample based on a division rate of the clock and data recovery system.

10. A clock and data recovery system comprising:
a sampler configured to sample a serial data stream having a plurality of data periods on at least one phase of a clock signal, wherein the sampler is configured to extract samples from the serial data stream, the samples comprising a data sample of one or more bits in the serial data stream and a transition sample of the one or more bits, wherein when the clock and data recovery system is in a locked state, the data sample is taken from a first interval into a data period and the transition sample is taken from a second interval into the data period, wherein the second interval is different from the first interval;

a deserializer configured to convert at least one bit of the data sample to a deserialized data sample, and to convert at least one bit of the transition sample to a deserialized transition sample;

a phase detector configured to receive the deserialized data sample and the deserialized transition sample, and to generate a phase error signal based at least partly on the deserialized data sample and the deserialized transition sample;

a frequency detector configured to receive the deserialized data sample and the deserialized transition sample, and to generate a frequency error signal based at least partly on the deserialized data sample and the deserialized transition sample;

a downsampler configured to select the at least one bit of the data sample to be converted to the deserialized data sample, the at least one bit of the transition sample to be converted to the deserialized transition sample; and an acquisition finite state machine configured to generate a mode signal based at least partly upon the frequency error signal, and wherein the downsampler is further configured to select the at least one bit of the data sample to be converted to the deserialized data sample based at least partly on the mode signal.

11. A method of providing phase alignment in a clock and data recovery system comprising:

sampling a serial data stream having a plurality of data periods on at least one phase of a clock signal to generate a data sample of at least one bit and a transition sample of at least one bit, wherein the data sample is taken from a first interval into a data period and the transition sample is taken from a second interval into the data period;

deserializing at least one bit of the data sample to create a deserialized data sample and at least one bit of the transition sample to create a deserialized transition sample; and processing the at least one bit of the deserialized data sample and the at least one bit of the deserialized transition sample in parallel to generate a phase error signal and a frequency error signal, thereby providing phase alignment in the clock and data recovery system, wherein the steps of sampling, deserializing, and processing are performed by electronic hardware, wherein the data sample comprises at least two bits taken from at least two data periods and the transition sample comprises at least two bits taken from the at least two data periods, and the step of deserializing comprises deserializing the at least two bits of the data sample to create a deserialized data sample and the at least two bits of the transition sample to create a deserialized transition sample.

12. The method of claim 11, further comprising selecting the at least one bit of the data sample to be deserialized and the at least one bit of the transition sample to be deserialized using a downsampler.

13. The method of claim 11, wherein the data sample comprises at least eight bits taken from at least eight data periods and the transition sample comprises at least eight bits taken from at least eight data periods, and the step of deserializing comprises deserializing at least eight bits of the data sample to create a deserialized data sample and at least eight bits of the transition sample to create a deserialized transition sample.

14. The method of claim 11, wherein the first interval into the data period is substantially halfway into the data period and the second interval into the data period is substantially the beginning of the data period.

15. The method of claim 11, wherein the deserialized data sample comprises at least eight bits.

16. The method of claim 11, wherein the deserialized data sample comprises at least ten bits but no more than sixteen bits.

17. The method of claim 11, further comprising controlling the frequency of a clock signal at least partly in response to the phase error signal and the frequency error signal.

* * * * *